(12) United States Patent
Tezuka et al.

(10) Patent No.: US 8,288,760 B2
(45) Date of Patent: Oct. 16, 2012

(54) FIELD EFFECT TRANSISTOR, INTEGRATED CIRCUIT ELEMENT, AND METHOD FOR MANUFACTURING THE SAME

(75) Inventors: Tsutomu Tezuka, Yokohama (JP); Toshifumi Irisawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 12/662,879

(22) Filed: May 10, 2010

(65) Prior Publication Data
US 2010/0219480 A1 Sep. 2, 2010

Related U.S. Application Data

(62) Division of application No. 11/725,469, filed on Mar. 20, 2007, now Pat. No. 7,728,324.

(30) Foreign Application Priority Data

Jun. 30, 2006 (JP) .................................. 2006-182448

(51) Int. Cl.
*H01L 29/06* (2006.01)
(52) U.S. Cl. ................. 257/29; 257/20; 257/27; 257/63
(58) Field of Classification Search ..................... 257/29, 257/20, 27, 63
See application file for complete search history.

(56) References Cited

U.S. PATENT DOCUMENTS

| | | | |
|---|---|---|---|
| 6,369,438 B1 | 4/2002 | Sugiyama et al. | |
| 6,607,948 B1 | 8/2003 | Sugiyama et al. | |
| 6,709,941 B2 | 3/2004 | Fujimaki | |
| 6,774,390 B2 | 8/2004 | Sugiyama et al. | |
| 6,917,096 B2 | 7/2005 | Sugiyama et al. | |
| 7,009,200 B2 | 3/2006 | Tezuka et al. | |
| 7,405,142 B2 | 7/2008 | Shiono et al. | |
| 2004/0251458 A1 | 12/2004 | Mizushima et al. | |
| 2005/0098234 A1 | 5/2005 | Nakaharai et al. | |
| 2005/0269595 A1 | 12/2005 | Tezuka | |
| 2006/0081876 A1* | 4/2006 | Monfray et al. | 257/192 |
| 2006/0121679 A1* | 6/2006 | Lee et al. | 438/300 |

FOREIGN PATENT DOCUMENTS

| | | |
|---|---|---|
| JP | 2002-76333 | 3/2002 |
| JP | 2003-243667 | 8/2003 |
| JP | 2005-45263 | 2/2005 |
| JP | 2005-79517 | 3/2005 |
| JP | 2005-159362 | 6/2005 |
| JP | 2005-203798 | 7/2005 |
| JP | 2007-258485 | 10/2007 |

OTHER PUBLICATIONS

Liow et al., "Investigation of silicon-germanium fins fabricated using germanium condensation on vertical compliant structures," Applied Physics Letters (2005), 87:262104-1-262104-3.

(Continued)

*Primary Examiner* — Long Pham
(74) *Attorney, Agent, or Firm* — Finnegan, Henderson, Farabow, Garrett & Dunner, L.L.P.

(57) ABSTRACT

A field effect transistor of an embodiment of the present invention includes, a semiconductor substrate containing Si atoms; a protruding structure formed on the semiconductor substrate; a channel region formed in the protruding structure and containing Ge atoms; an under channel region formed under the channel region in the protruding structure and containing Si and Ge atoms, the Ge composition ratio among Si and Ge atoms contained in the under channel region continuously changing from the channel region side to the semiconductor substrate side; a gate insulating film formed on the channel region; and a gate electrode formed on the gate insulating film on the channel region.

10 Claims, 20 Drawing Sheets

OTHER PUBLICATIONS

Notification of Reason for Rejection issued by the Japanese Patent Office on Jun. 27, 2008, for Japanese Patent Application No. 2006-182448, and English-language translation thereof.

Notification of Reasons for Rejection issued by the Japanese Patent Office on Feb. 24, 2012, for Japanese Patent Application No. 2008-214517, and English-language translation thereof.

* cited by examiner

FIELD EFFECT TRANSISTOR, INTEGRATED CIRCUIT ELEMENT, AND METHOD FOR MANUFACTURING THE SAME

This is a division of application Ser. No. 11/725,469, filed Mar. 20, 2007, now Pat. No. 7,728,324, which is incorporated herein by reference.

CROSS REFERENCE TO RELATED APPLICATION

This application is based upon and claims the benefit of priority from prior Japanese Patent Application No. 2006-182448, filed on Jun. 30, 2006, the entire contents of which are incorporated herein by reference.

BACKGROUND OF THE INVENTION

1. Field of the Invention

The present invention relates to a field effect transistor, an integrated circuit element, and a method for manufacturing the same.

2. Background Art

Increasing a drive current per unit gate length of each MOSFET, by reducing the gate length and thinning the gate insulating film, is a conventional general approach to enhance the performance and functionality of a CMOS circuit element. Thereby, the size of a MOSFET to provide a required drive current is reduced, which allows higher integration of MOSFETs, and a drive voltage to provide a required drive current is decreased, which reduces power consumption per unit element.

However, in recent years, technical difficulty to achieve a required high performance and functionality, by reducing the gate length and thinning the gate insulating film, has been rapidly increasing. Use of high-mobility channel material is effective to alleviate this situation. For example, strain-free SiGe (silicon germanium) and Ge (germanium) are effectively used for both of pMOS and nMOS, since these materials have higher electron mobility and hole mobility than Si (silicon). Further, compressive-strained Si, SiGe and Ge are effectively used for pMOS, since these materials have high hole mobility. Further, tensile-strained Si, SiGe and Ge are effectively used for nMOS, since these materials have high electron mobility.

Furthermore, it is possible, by using a structure having a plurality of gates, to increase the drive current while maintaining a sufficiently low off-state current. Examples of the structure include, a double-gate structure in which a gate electrode and a gate insulating film are formed on both sides of a channel, a tri-gate structure in which a gate electrode and a gate insulating film are formed on three sides (right side, left side, and upper side) of a channel, and a gate-all-around (GAA) structure in which a channel is surrounded by a gate electrode, and a gate insulating film. These structures are called multi-gate structures (three-dimensional gate structures). Electrostatic force provided by their gates to control channel carriers, is larger than that provided by a typical single gate structure (planar gate structure). Therefore, in these multi-gate structures, the short channel effect can be suppressed even when the channel impurity concentration is low. In particular, an FET manufactured by, forming a plate-like protrusion (fin) on a substrate, forming a channel in the protrusion, and forming a gate electrode and a gate insulating film on both sides of the channel, is called FinFET.

Use of the high-mobility channel material and any of the multi-gate structures in combination, provides higher performance and functionality compared to using each technology alone. In fact, various kinds of preceding art using these technologies in combination, are disclosed in various preceding documents.

The preceding art can be broadly classified into three types of technologies.

The first preceding art relates to an FET formed on an SOI (Semiconductor-On-Insulator) substrate. For example, JP-A 2003-243667 (KOKAI) discloses a strained Si-FinFET manufactured by, forming a fin made of SiGe on an embedded insulating film of an SGOI (SiGe-On-Insulator) substrate, and forming strained Si around the fin. Further, JP-A 2005-159362 (KOKAI) discloses a strained Ge-FinFET manufactured by, forming a fin made of Si on an embedded insulating film of an SOI (Si-On-Insulator) substrate, and forming strained Ge around the fin. In each of these FETs, a strained layer that receives strain is formed on a core layer that induces strain, and a hetero-interface is present between the core layer and the strained layer.

The second preceding art relates to an FET formed on a bulk substrate. For example, JP-A 2005-203798 (KOKAI) discloses a multi-gate transistor manufactured by, forming a Ge layer in a predetermined region on a Si substrate by vapor epitaxial deposition, and forming a gate structure that uses the resultant facet as the channel. Further, JP-A 2005-79517 (KOKAI) discloses a multichannel-type double-gate transistor manufactured by, forming an amorphous SiGe layer in the lateral direction from the source/drain region in a Si layer by solid epitaxial deposition. In the former case, the Ge layer is formed on the Si substrate, and a hetero-interface is present between the Si substrate and the Ge layer. In the latter case, the SiGe layer is formed on the Si layer, and a hetero-interface is present between the Si layer and the SiGe layer.

The third preceding art relates to a basic technology assumed to be applied to an FET. "Tsung-Yang Liow et al., Applied Physics Letters Vol. 87, p 262104 (2005)" discloses a method for forming a high Ge composition SiGe-Fin structure on a lattice-relaxed SiGe substrate. More specifically, the document discloses a method such as, forming a lattice-relaxed SiGe layer having a thickness of about a few μm on a Si substrate, processing the SiGe layer into a fin-like shape, and performing thermal oxidization of the Si substrate, to thin the fin and increase Ge composition in the fin.

However, these kinds of preceding art have some disadvantages.

In the first and second preceding art, a hetero-interface in which Ge concentration abruptly changes across the interface, such as the hetero-interface between the Si layer and the SiGe layer and the hetero-interface between the Si layer and the Ge layer, is formed during the epitaxial deposition. Therefore, in the first and second preceding art, there is a strong possibility that lattice defects occur in a channel region or the like. The lattice defects in the channel region or the like cause problems, such as increased leak current in the transistor and reduced reliability of the transistor. In the third preceding art, oxidation-induced condensation at a low temperature of 875° C. causes insufficient interdiffusion of Si and Ge atoms, which also causes abrupt gradient of Ge concentration and the occurrence of lattice defects. Further, in "Tsung-Yang Liow et al., Applied Physics Letters Vol. 87, p 262104 (2005)" corresponding to the third art, the substrate including the Si substrate and the lattice-relaxed SiGe layer, is employed as a substrate. Since the cost for forming the thick SiGe layer by the epitaxial deposition is very high, the price of this substrate is a couple to decades of times higher than that of a typical bulk substrate. Therefore, if such a substrate is employed to manufacture transistors, the cost of the entire integrated circuit element increases greatly. In addition, the heat conductivity of SiGe is lower than that of Si by a couple of orders. Therefore, in a transistor manufactured by using such a substrate, Joule heat generated when a current passes through a channel is not dissipated sufficiently, which increases the channel temperature. As a result, characteristics of the transistor are degraded.

SUMMARY OF THE INVENTION

An embodiment of the present invention is, for example, a field effect transistor including:
a semiconductor substrate containing Si atoms;
a protruding structure formed on the semiconductor substrate;
a channel region formed in the protruding structure and containing Ge atoms;
an under channel region formed under the channel region in the protruding structure and containing Si and Ge atoms, the Ge composition ratio among Si and Ge atoms contained in the under channel region continuously changing from the channel region side to the semiconductor substrate side;
a gate insulating film formed on the channel region; and
a gate electrode formed on the gate insulating film on the channel region.

Another embodiment of the present invention is, for example, a field effect transistor including:
a semiconductor substrate containing Si atoms;
a protruding structure formed on the semiconductor substrate;
a channel region formed in the protruding structure and containing Ge atoms;
an insulating film embedded under the channel region;
a gate insulating film formed on the channel region; and
a gate electrode formed on the gate insulating film on the channel region.

Another embodiment of the present invention is, for example, a method for manufacturing a field effect transistor, the method including:
forming a protruding structure on a semiconductor substrate containing Si atoms;
by thermal oxidization, forming a channel region containing Ge atoms in the protruding structure;
by changing the temperature of the thermal oxidization from a high temperature to a low temperature, forming an under channel region containing Si and Ge atoms under the channel region in the protruding structure, the Ge composition ratio among Si and Ge atoms contained in the under channel region continuously changing from the channel region side to the semiconductor substrate side;
forming a gate insulating film on the channel region; and
forming a gate electrode on the gate insulating film on the channel region.

Another embodiment of the present invention is, for example, a method for manufacturing a field effect transistor, the method including:
forming a protruding structure on a semiconductor substrate containing Si atoms;
by thermal oxidization under the condition that a mask covers the area around the region where a channel region is to be formed, forming a channel region containing Ge atoms in the protruding structure;
by changing the temperature of the thermal oxidization from a high temperature to a low temperature, forming an under channel region containing Si and Ge atoms under the channel region in the protruding structure, the Ge composition ratio among Si and Ge atoms contained in the under channel region continuously changing from the channel region side to the semiconductor substrate side, and forming channel side regions containing Si and Ge atoms at sides of the channel region, the Ge composition ratio among Si and Ge atoms contained in the channel side regions continuously changing from the channel region sides to source/drain region sides;
forming source/drain regions containing Si and Ge atoms at sides of the channel region, the Ge composition ratio among Si and Ge atoms contained in the source/drain regions being lower than the Ge composition ratio in the channel region;
forming a gate insulating film on the channel region; and
forming a gate electrode on the gate insulating film on the channel region.

Another embodiment of the present invention is, for example, a method for manufacturing a field effect transistor, the method including:
forming a protruding structure on a semiconductor substrate containing Si atoms;
forming a cavity in the protruding structure;
embedding an insulating film in the cavity;
by thermal oxidization, forming a channel region containing Ge atoms in the protruding structure;
forming a gate insulating film on the channel region; and
forming a gate electrode on the gate insulating film on the channel region.

DESCRIPTION OF THE EMBODIMENTS (First Embodiment)

Figure 1:
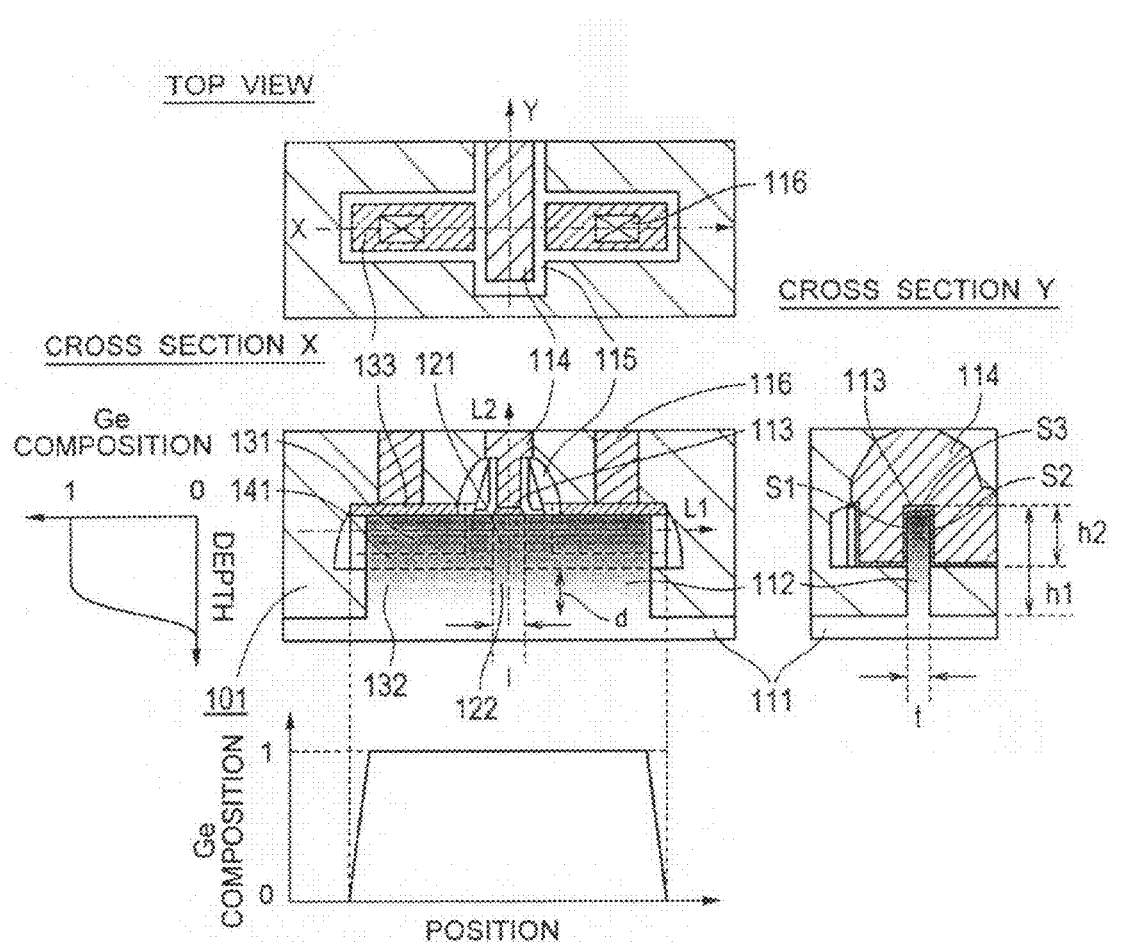
FIG. 1 is an explanatory view showing a transistor of the first embodiment.

FIG. 1 is an explanatory view showing a field effect transistor 101 of the first embodiment. FIG. 1 shows, the top view of the field effect transistor 101, the side cross-sectional view showing the cross section X of the field effect transistor 101, and the side cross-sectional view showing the cross section Y of the field effect transistor 101. The field effect transistor (FET) 101 shown in FIG. 1 is a MOSFET, which may be a P-MOSFET or an N-MOSFET.

The field effect transistor 101 shown in FIG. 1 includes a Si substrate 111 which is a specific example of a semiconductor substrate, a fin structure 112 which is a specific example of a protruding structure, a gate insulating film 113, a gate electrode 114, side wall insulating films 115, source/drain electrodes 116, and the like. In the fin structure 112 shown in FIG. 1, there are formed a channel region 121, an under channel region 122, source/drain regions 131, under source/drain regions 132, over source/drain regions 133, extension regions 141, and the like.

The field effect transistor 101 employs a multi-gate structure, so gates are formed on a plurality of "channel surfaces" of the channel region 121 (which mean "exposed sides" of the channel region 121 exposed to the surface of the fin structure 112). Particularly in this embodiment, the field effect transistor 101 employs a tri-gate structure, so gates are formed on the following three channel surfaces of the channel region 121: a first lateral channel surface S1, a second lateral channel surface S2, and an upper channel surface S3. The channel surfaces S1 and S2 which are perpendicular to the principal plane of the Si substrate 111, and the channel surface S3 which is parallel to the principal plane of the Si substrate 111, are used as surfaces to form gates thereon. In the field effect transistor 101, the gate insulating film 113 is formed on the channel region 121 (in detail, on the plurality of channel surfaces of the channel region 121: S1, S2, and S3). In the field effect transistor 101, the gate electrode 114 is formed on the gate insulating film 113 on the channel region 121 (in detail, on the plurality of channel surfaces of the channel region 121: S1, S2, and S3).

In the field effect transistor 101, the fin structure 112 is formed on the Si substrate 111. The Si substrate 111 is a semiconductor substrate made of Si atoms and corresponds to a bulk Si substrate. The fin structure 112 is a fin-shaped protruding structure and made of a semiconductor layer containing Si and Ge atoms. The substrate 111 may contain only Si atoms, or may contain Si atoms and other atoms. The fin structure 112 may contain only Si and Ge atoms, or may contain Si and Ge atoms and other atoms.

In the fin structure 112, the source/drain regions 131 and the extension regions 141 are formed at sides of the channel region 121. The source/drain regions 131 and the extension regions 141 are provided on both sides of the channel region 121 such that the channel region 121 is sandwiched by the source/drain regions 131 and the extension regions 141. The fin structure 112 contains Si atoms and Ge atoms, and the ratio of the Si atoms to the Ge atoms contained therein varies depending on locations. The channel region 121, the source/drain regions 131, and the extension regions 141 are Ge regions made of Ge atoms or $Si_{1-x}Ge_x$ regions made of Si and Ge atoms, where "x" represents the Ge composition ratio among contained Si and Ge atoms and is calculated by the following equation: (molar concentration of Ge atoms)/(molar concentration of Si atoms+molar concentration of Ge atoms). FIG. 1 also shows a profile of the Ge composition ratio "x" on the horizontal line L1 connecting the channel region 121, the source/drain regions 131, and the extension regions 141. The channel region 121, the source/drain regions 131, and the extension regions 141 may contain only Ge atoms, or may contain Ge atoms and other atoms. The channel region 121, the source/drain regions 131, and the extension regions 141 may contain only Si and Ge atoms, or may contain Si and Ge atoms and other atoms.

Furthermore, under the channel region 121, there is a region where the Ge composition ratio "x" continuously changes from the channel region 121 side to the Si substrate 111 side (the under channel region 122). This region extends to regions under the source/drain regions 131 (the under source/drain regions 132). FIG. 1 also shows a profile of the Ge composition ratio "x" on the vertical line L2 connecting the channel region 121 and the under channel region 122. The under channel region 122 and the under source/drain regions 132 may contain only Si and Ge atoms, or may contain Si and Ge atoms and other atoms.

Furthermore, over the source/drain regions 131, there are regions made of Ni (nickel) silicide (the over source/drain regions 133). Each of the regions in the fin structure 112 will be described below in more detail.

As apparent from the profile shown in FIG. 1, the channel region 121, the source/drain regions 131, and the extension regions 141 in this embodiment are Ge regions, in which the Ge composition ratio "x" is 100%. These regions may be $Si_{1-x}Ge_x$ regions having a Ge composition ratio "x" of 80% or higher. Comparing the mobility in the channel region 121 made of Si and the mobility in the channel region 121 made of $Si_{1-x}Ge_x$, in the case of pMOS, the latter is higher at an arbitrary Ge composition ratio "x", while in the case of nMOS, the latter is higher only when the Ge composition ratio "x" is higher than 80%. Therefore, the Ge composition ratio "x" of 80% or higher in the channel region 121 and the like provides an advantage that the Ge composition ratio "x" in the channel region 121 and the like can be the common value for a pMOS and an nMOS.

The distance from the upper side of the fin structure 112 (the interface with the gate insulating film 113) to the lower side of the fin structure 112 (the interface with the Si substrate 111), that is, the height of the fin structure 112 "h1", is 200 nm in this embodiment. The height of the channel region 121 surrounded by the gate insulating film 113 and the gate electrode 114, "h2", is 100 nm in this embodiment. As described above, under the channel region 121, source/drain regions 131, and extension regions 141, the Ge composition ratio "x" continuously changes (decreases) in the vertical direction from the channel region 121 side to the Si substrate 111 side, such that the Ge composition ratio "x" decreases to as low as about 1% at the height substantially same as the upper side of the Si substrate 111. The shorter is the "d": the distance from the height of the lower end of the gates surrounding the fin structure 112 (i.e. the lower end of the channel region 121) to the height where the Ge composition ratio "x" becomes 1%, the closer are the channel region 121 and the Si substrate 111 whose heat conductivity is high, resulting in good heat dissipation from the channel region 121. The present inventor performed a simulation and found that the distance "d" of 250 nm or shorter could suppress the temperature increase in the channel region 121 to 30 K or lower. In this embodiment, since the distance "d" is 100 nm (=h1−h2=200 [nm]−100 [nm]) which is very short, the heat dissipation from the channel region 121 is excellent. Since the distance "d" is the amount corresponding to the thickness of the portion where the under channel region 122 is present, the distance "d" is hereinafter referred to as the thickness of the under channel region 122 (from the channel region 121 side to the Si substrate 111 side). The fin width "t" is 10 nm in this embodiment. The gate length "l" is 20 nm in this embodiment.

Figure 16:
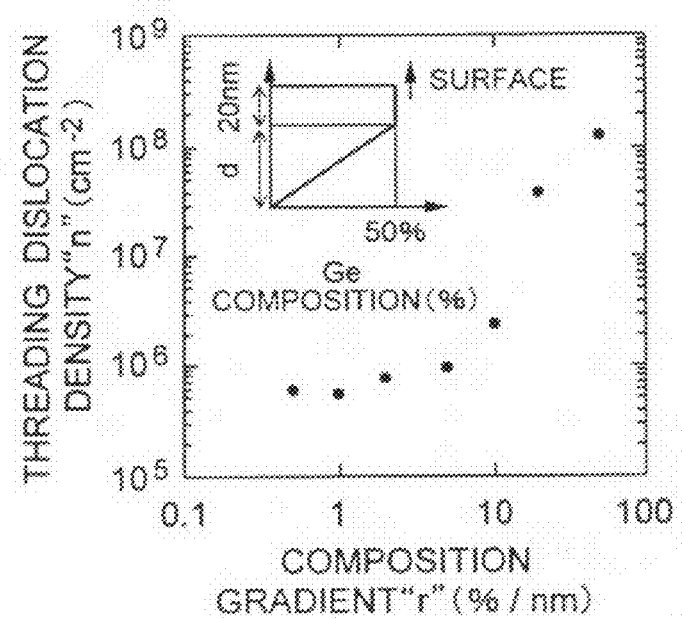
FIG. 16 shows the relationship between the composition gradient and the threading dislocation density in a $Si_{1-x}Ge_x$ region.

Furthermore, under the channel region 121, source/drain regions 131, and extension regions 141, the gradient of the profile in FIG. 1, i.e., the rate of change of the Ge composition ratio "x" from the channel region 121 side to the Si substrate 111 side, "r", is 5%/nm or lower. The composition gradient "r" and the occurrence of lattice defects have the following close correlation, so that the composition gradient "r" in the under channel region 122 and the like is set to 5%/nm or lower in this embodiment. The graph in FIG. 16 shows the relationship between the composition gradient "r" and the threading dislocation density "n" in a $Si_{1-x}Ge_x$ region. In the graph in FIG. 16, there is plotted the measurement result obtained by, forming a gradient composition layer of $Si_{1-x}Ge_x$ having a thickness of d [nm] and a uniform composition layer of $Si_{0.5}Ge_{0.5}$ having a thickness of 20 [nm] on a Si substrate by epitaxial deposition, annealing the wafer formed of these three layers at 800° C. for 30 minutes, and measuring the threading dislocation density "n" in the gradient composition layer. The composition gradient "r" [%/nm] in the gradient composition layer is calculated by 50 [%]/d [nm]. According to the measurement result obtained by the present inventor, it has been found that when the composition gradient "r" exceeds 5%/nm, the threading dislocation density "n" abruptly increases. In this embodiment, the under channel region 122 and the like having gradient composition are provided under the channel region 121 and the like, which reduces the possibility of the occurrence of lattice defects in the channel region 121 and the like, and the composition gradient in the under channel region 122 and the like is set to 5%/nm or lower, which further reduces the possibility of the occurrence of lattice defects in the channel region 121, under channel region 122, and the like.

To achieve both the effect of dissipating heat from the channel region 121 and the effect of reducing the possibility of the occurrence of lattice defects in the channel region 121 and the like, the distance "d" is preferably within the range, for example, from 20 nm to 250 nm. However, since the distance "d" is set appropriately according to the fin width "t", the distance "d" is not limited to the above range.

In this embodiment, since it is not necessary to employ an SOI substrate as the substrate and a bulk substrate can be employed as the substrate, an inexpensive bulk substrate is employed instead of an expensive SOI substrate. This reduces the cost of the entire integrated circuit element in this embodiment.

In this embodiment, a P-MOSFET and an N-MOSFET which form a CMOS circuit, are constituted by the fundamental structures described above. In the pMOS, boron is doped into the source/drain regions 131 and the extension regions 141, while arsenic is doped into the channel region 121, under channel region 122, under source/drain regions 132, and the like. In the nMOS, antimony is doped into the source/drain regions 131 and the extension regions 141, while boron is doped into the channel region 121, under channel region 122, under source/drain regions 132, and the like. The over source/drain regions 133 and the gate electrode 114 are made of Ni silicide in this embodiment. The gate insulating film 113 is a HfSiON film having a thickness of 2.5 nm in this embodiment.

In the channel region 121, the stress resulting from the difference of lattice constants between Si and Ge is relaxed when the horizontal direction (Y direction) and the vertical direction (Z direction), which are perpendicular to the current direction, become open ends substantially, but uniaxial compressive stress remains in the current direction (X direction). Therefore, in the channel region 121, there is 0.5% compressive strain in the current direction (X direction). As a result, the hole mobility in the channel region 121 is about five times the hole mobility of Si, while the electron mobility in the channel region 121 is about twice the electron mobility of Si. The strain in the channel region 121 decreases as the fin height "h1" increases, while the strain increases as the fin height "h1" decreases. The uniaxial compressive stress in this embodiment is effective to improve the hole mobility, but it reduces the electron mobility. Examples of effective approaches to increase the drive force of the nMOS include, increasing the fin height "h1" (e.g. 500 nm) to decrease the compressive stress, using a Si nitride film having internal tensile stress as the side wall insulating films 115 to cancel the compressive stress, applying tensile stress in the opposite direction of the compressive stress, and the like. Other examples of effective approaches include, increasing the thickness of the SiGe layer in the extension, decreasing the average Ge composition, and the like. On the other hand, examples of effective approaches to increase the drive force of the pMOS include, decreasing the fin height "h1" (e.g. 100 nm) to increase the compressive stress, using a Si nitride film having internal compressive stress as the side wall insulating films 115 to further increase the compressive stress, and the like.

FIGS. 2A to 2I are explanatory views showing a method for manufacturing the field effect transistor 101 of the first embodiment. FIGS. 2A to 2I show, top views concerning the field effect transistor 101 to be manufactured, and side cross-sectional views showing the cross section X (see FIG. 1) concerning the field effect transistor 101 to be manufactured.

Figure 2A:
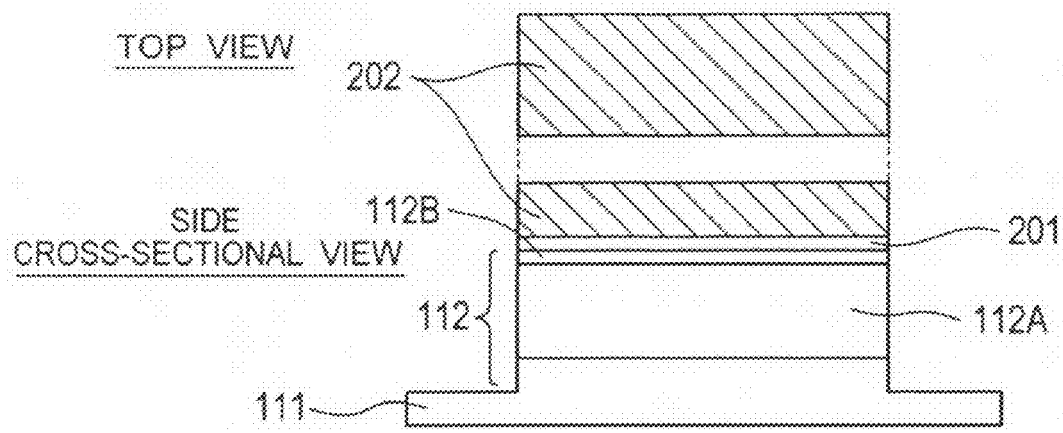
FIGS. 2A to 2I are explanatory views showing a method for manufacturing the transistor of the first embodiment.

Firstly, a strained $Si_{0.85}Ge_{0.15}$ layer 112A having a thickness of 120 nm, is formed on a Si substrate 111 by epitaxial deposition as a layer forming a fin structure 112, and a Si cap layer 112B having a thickness of 10 nm, is formed on the SiGe layer 112A by epitaxial deposition as a layer forming the fin structure 112. Then, a Si thermal oxide film 201 having a thickness of 4 nm is formed on the Si layer 112B, and a Si nitride film 202 is formed on the Si thermal oxide film 201 by CVD. Then, the Si nitride film 202 is patterned into a square shape by photolithography, and then, the Si layer 112B, the SiGe layer 112A, and the Si substrate 111 are etched to the depth of 150 nm by RIE. Thereby, the fin structure 112 is formed on the Si substrate 111 (FIG. 2A).

Figure 2B:
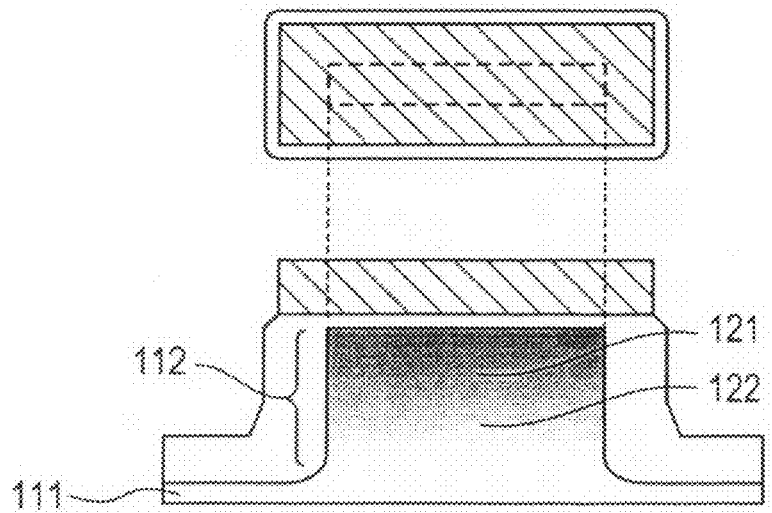

Next, the fin structure 112 is thinned and the Ge composition ratio in the fin structure 112 is increased, by thermal oxidation of the fin structure 112 (oxidation-induced condensation). The width of the fin after the thermal oxidation is 10 nm, and the Ge composition ratio in the fin structure 112 after the thermal oxidation is substantially 100% (FIG. 2B). During the thermal oxidation, the temperature of the thermal oxidation is changed (decreased) stepwise or continuously according to the change (increase) of Ge composition ratio. By such temperature adjustment, an under channel region 122 and the like having a composition gradient are formed under a channel region 121 and the like, and by controlling the rate of temperature change of the thermal oxidation temperature appropriately, the Ge atoms can be diffused appropriately to achieve a composition gradient of 5%/nm or lower in the under channel region 122 and the like. In this embodiment, during the thermal oxidation, the temperature of the thermal oxidation is decreased stepwise to 1150° C., 1050° C., 1000° C., and 870° C. according to the increase of the Ge composition ratio. Since the melting point of the $Si_{1-x}Ge_x$ layer 112A (x≧0.8) decreases with the increase in the Ge composition ratio "x", it is necessary to control the temperature of the thermal oxidation to be always lower than the melting point of the $Si_{1-x}Ge_x$ layer 112A, which decreases during thermal oxidization.

Figure 2C:
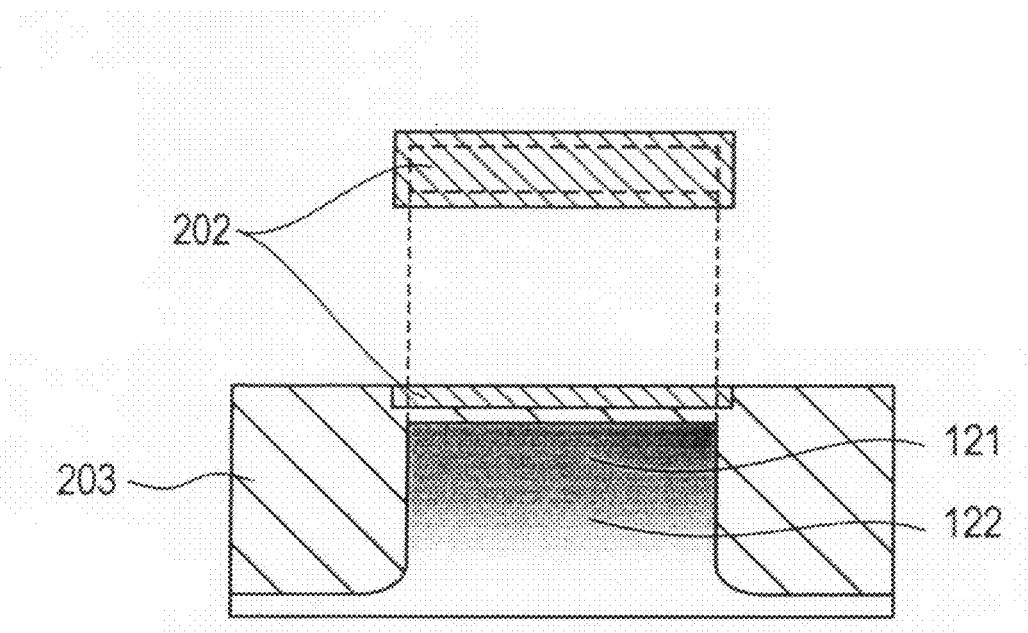

Next, the Si nitride film 202 is slimmed by CDE or wet etching with hot phosphoric acid. Then, a Si oxide film 203 is deposited by CVD, so that the region around the fin structure 112 is filled with the Si oxide film 203. Then, the Si oxide film 203 is planarized by CMP until the surface of the Si nitride film 202 is exposed. Then, channel ions and punch-through stopper ions (boron for nMOS and arsenic for pMOS) are implanted into the channel region 121, under channel region 122, and the like (FIG. 2C).

Figure 2D:
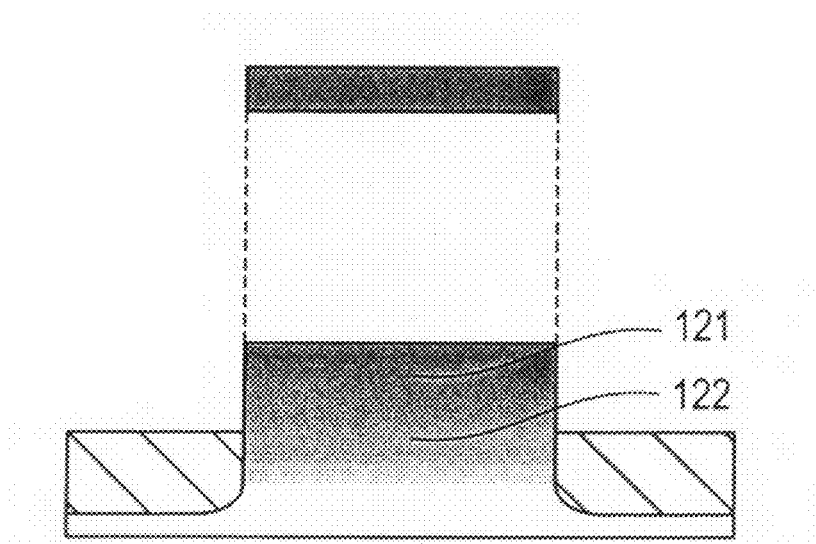

Next, the Si oxide film 203 is etched to the depth of 100 nm by RIE using the Si nitride film 202 as a mask. Then, the Si nitride film 202, and the residual Si oxide film 203 on the sides of the fin structure 112, are removed by wet etching with hot phosphoric acid and wet etching with diluted hydrofluoric acid. Thereby, a plurality of channel surfaces of the channel region 121 are exposed above the substrate (FIG. 2D).

Figure 2E:
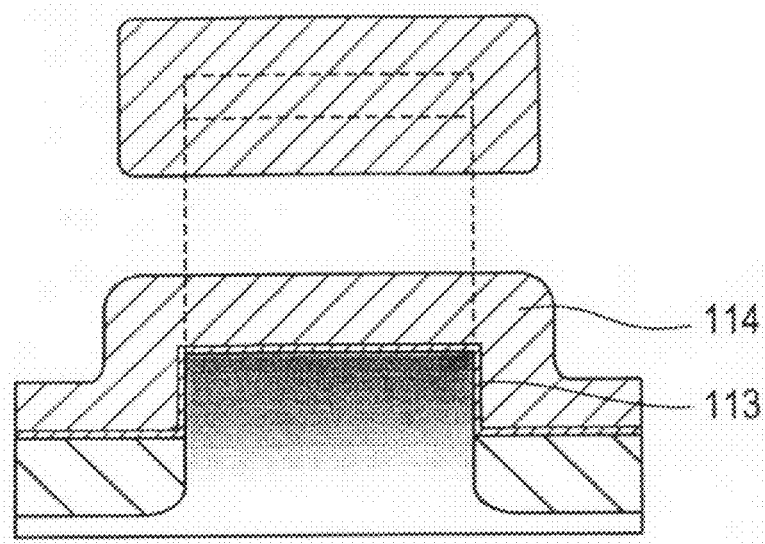

Next, a HfSiON film 113 having a thickness of 2.5 nm which is to be a gate insulating film 113, is deposited over the entire surface by CVD. Then, a poly Si layer 114 which is to be a gate electrode 114, is deposited over the entire surface (FIG. 2E).

Figure 2F:
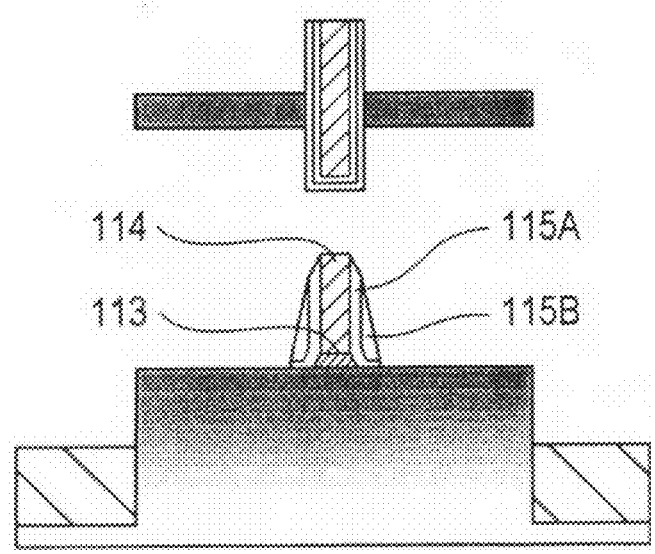

Next, gate processing is performed by photolithography and RIE. Then, a Si oxide film 115A and a Si nitride film 115B which is to be side wall insulating films 115 (first side wall insulating films) are deposited, and gate side wall processing is performed by RIE (FIG. 2F).

Figure 2G:
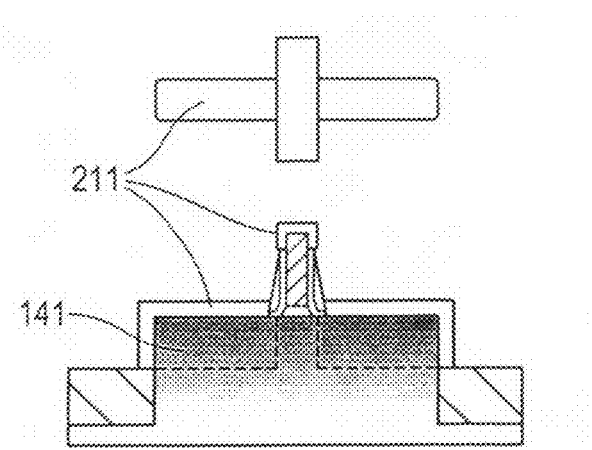

Next, a SiGe cap 211 is formed on the exposed surface of the fin structure 112 by epitaxial deposition. Then, impurity ions (antimony for nMOS and boron for pMOS) are implanted into the fin structure 112 to form the raised extension region 141 in the fin structure 112. The impurities are implanted into the fin structure 112 from the oblique direction, and they are also implanted into side wall insulating films 115. The Ge composition ratio in the SiGe cap 211 is gradually decreased from the lower side (the interface with the fin structure) to the upper side in order to suppress the occurrence of dislocation, such that the top surface of the SiGe cap 211 is made of only Si (i.e. x=0). It is not necessary that the Ge composition in the cap change continuously, and the Ge composition in the cap may be uniform composition (e.g., x=0.4) or stepwise composition (e.g., a film of x=0 is laminated on a film of x=0.4). In this case, however, the thickness of each of the layers is preferably smaller than the critical film thickness within which dislocation may not occur. A specific value of the critical film thickness is described, for example, in "D. C. Houghton, Journal of Applied Physics, vol. 70, p. 2136 (1991)." Then, the impurities are activated by RTA (FIG. 2G).

Figure 2H:
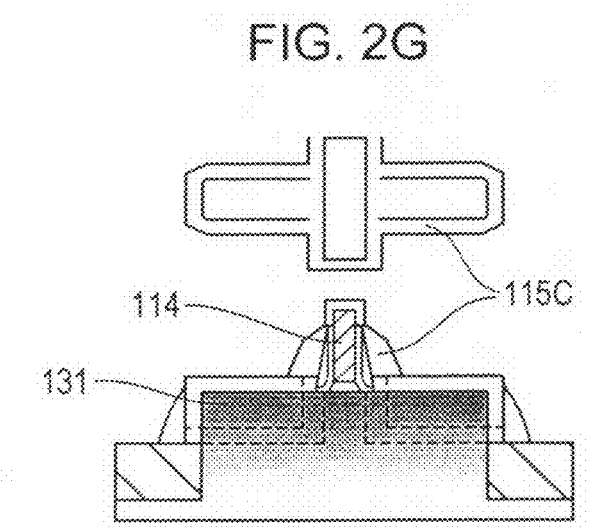

Next, a Si oxide film 115C which is to be side wall insulating films 115 (second side wall insulating films) is deposited by CVD, and gate side wall processing is performed by RIE. Then, impurity ions (antimony for nMOS and boron for pMOS) are implanted into source/drain regions 131 and a poly Si layer 114 (gate electrode 114) (FIG. 2H).

Figure 2I:
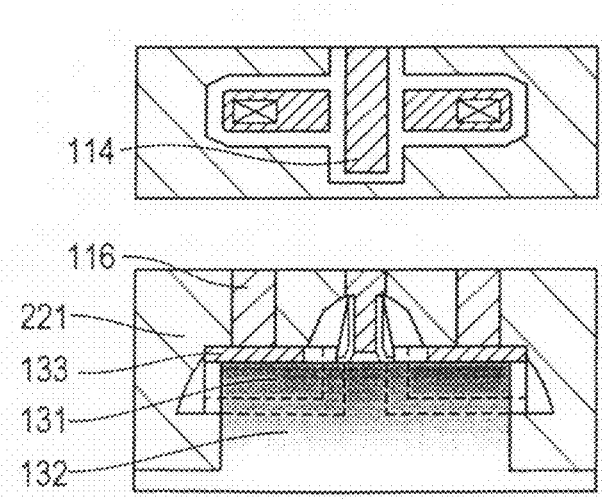

Next, the upper sides of the source/drain regions 131 and the entire poly Si layer 114 (gate electrode 114) are Ni-silicided. Then, the gate structure is covered with an interlayer insulating film 221. Then, contact holes are formed in the interlayer insulating film 221. Then, source/drain electrodes 116 are formed in the contact holes. Thereby, the field effect transistor 101 shown in FIG. 1 is completed (FIG. 2I).

In this embodiment, although the upper side of the fin structure 112 is used as a channel, it is not necessary that the upper side of the fin structure 112 be used as a channel. When the upper side is not used as a channel, the process of removing the Si nitride film 202 (FIG. 2D) is not required.

According to the transistor structure of this embodiment, the high mobility resulting from strain-free Ge or strained Ge provides a drive current larger than that achieved in a conventional Si-FinFET. Further, since there is no abrupt change of Ge composition (hetero-interface) between the channel region 121 and the Si substrate 111, crystal defects will not likely occur in the channel region 121 and the like. Further, since the fin structure 112 is formed on the bulk Si substrate 111, the cost is reduced compared to the case where the fin structure 112 is formed on an SOI substrate or a lattice-relaxed SiGe substrate. Further, since the heat dissipation efficiency from the channel region 121 to the Si substrate 111 is excellent and hence the channel temperature can be maintained at low temperatures, a larger drive current is obtained. In addition, there is also an advantage such that transistors of this embodiment can be combined easily with a bulk CMOS-based analog circuit and/or interface circuit to achieve SoC (System-on-Chip).

Further, according to the transistor manufacturing method of this embodiment, compared to the case where a high concentration SiGe layer (or Ge layer) is formed directly on a Si substrate by epitaxial deposition, the occurrence of lattice defects is reduced and hence the yield is improved; this is because the stress is released from the edges of the fin structure 112 and the hetero-interface is eliminated by the Ge diffusion during the high temperature oxidation (oxidation-induced condensation).

(Second Embodiment)

Figure 3:
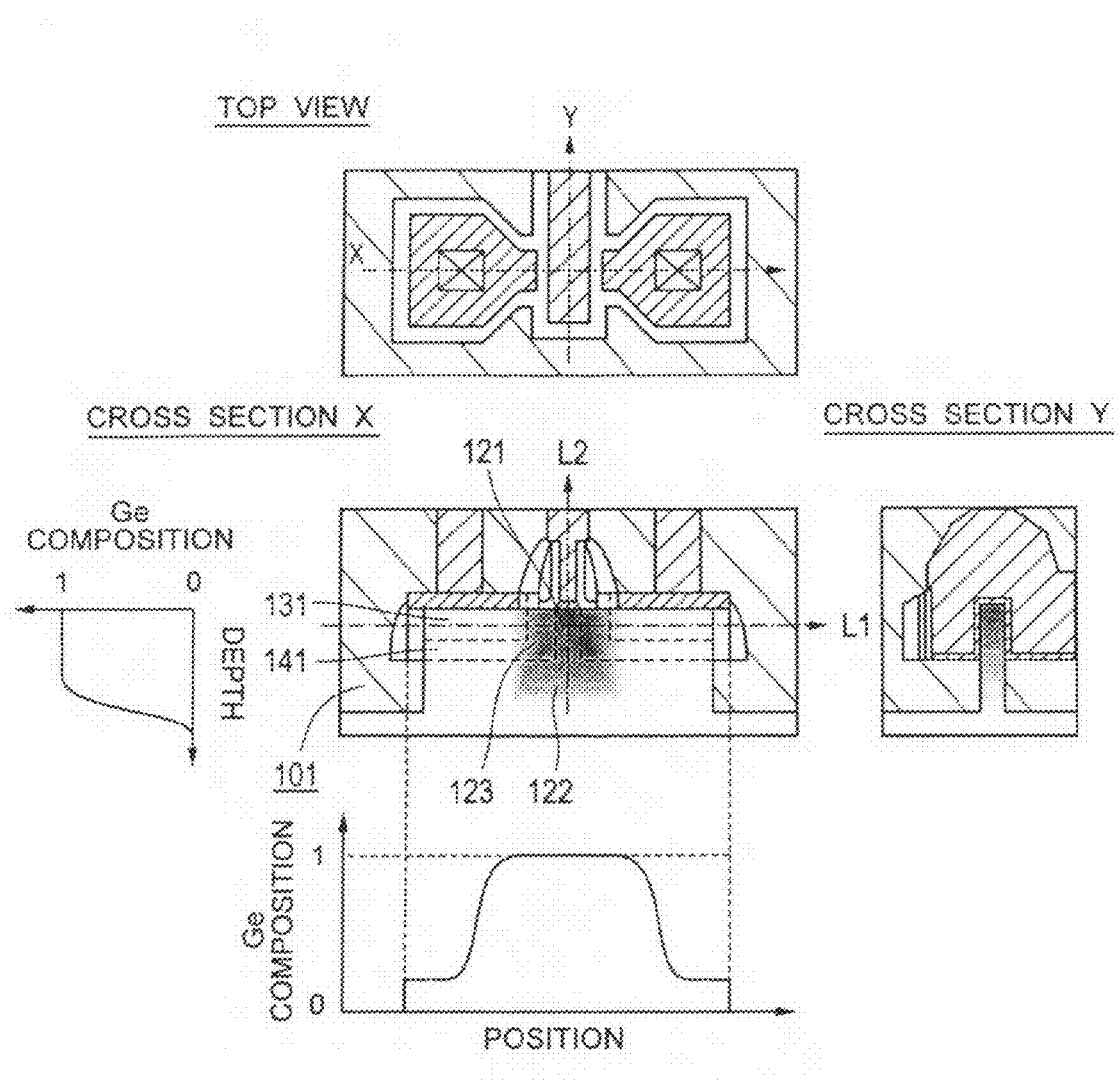
FIG. 3 is an explanatory view showing a transistor of the second embodiment.

FIG. 3 is an explanatory view showing a field effect transistor 101 of the second embodiment. With regard to the field effect transistor 101 of the second embodiment, description of the things common to the first embodiment will be omitted (the following embodiments will be treated similarly).

In this embodiment, the channel region 121 and the source/drain regions 131 are a Ge region and $Si_{1-x}Ge_x$ regions respectively, so the Ge composition ratio "x" in the source/drain regions 131 is lower than the Ge composition ratio "x" in the channel region 121. In the case that the Ge composition ratio in the source/drain regions 131 is lower than the Ge composition ratio in the channel region 121 like this embodiment, the band gaps in the source/drain regions 131 become larger, so that the pn junction leakages in the source/drain regions 131 will be reduced.

Furthermore, in this embodiment, as apparent from the top view of FIG. 3, the width of the source/drain regions 131 in the Y direction is larger than the width of the channel region 121 in the Y direction. Therefore, the parasitic resistance in the FET 101 of the second embodiment is smaller than that in the FET 101 of the first embodiment.

Furthermore, in this embodiment, at sides of the channel region 121, there are regions, between the channel region 121 and the source/drain regions 131, where the Ge composition ratio continuously changes from the channel region 121 sides to the source/drain region 131 sides (channel side regions 123). FIG. 3 also shows a profile of the Ge composition ratio "x" on the horizontal line L1 connecting the channel region 121, the channel side regions 123, and the source/drain regions 131. As shown in the profile, at the sides of the channel region 121, the Ge composition ratio "x" continuously changes (decreases) in the horizontal direction from the channel region 121 sides to the source/drain region 131 sides. In this embodiment, the channel side regions 123 having gradient composition is provided at sides of the channel region 121, which reduces the possibility of the occurrence of lattice defects in the channel region 121 and the like. The channel side regions 123 may contain only Si and Ge atoms, or may contain Si and Ge atoms and other atoms.

FIGS. 4A to 4I are explanatory views showing a method for manufacturing the field effect transistor 101 of the second embodiment. With regard to the method for manufacturing the field effect transistor 101 of the second embodiment, description of the things common to the first embodiment will be omitted (the following embodiments will be treated similarly).

Figure 4A:
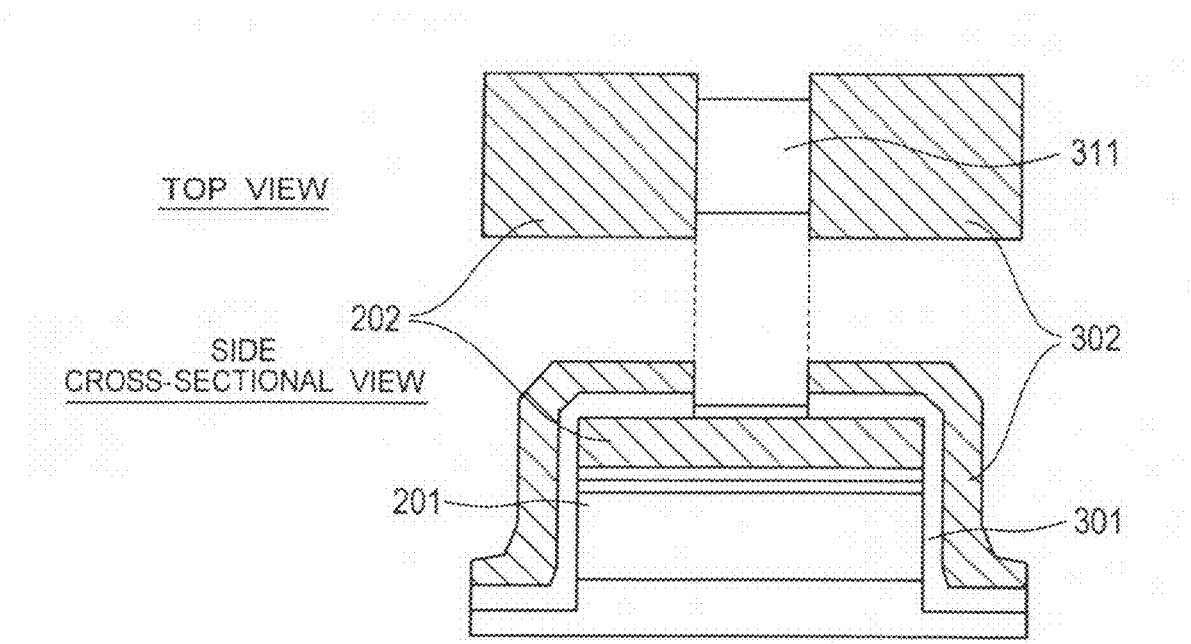
FIGS. 4A to 4I are explanatory views showing a method for manufacturing the transistor of the second embodiment.

Firstly, as in FIG. 2A, the fin structure 112 is formed on the Si substrate 111. Then, a Si oxide film 301 is deposited over the entire surface by CVD, and then, a Si nitride film 302 is deposited over the entire surface by CVD. Then, a window 311 is formed in the Si oxide film 301 and the Si nitride film 302 by photolithography and RIE. The window 311 is formed in the region where the channel region 121 is to be formed. Thereby, the area around the region where the channel region 121 is to be formed (e.g. the region where the source/drain regions 131 are to be formed), is covered with a mask formed of the Si oxide film 301 and the Si nitride film 302 (FIG. 4A).

Figure 4B:
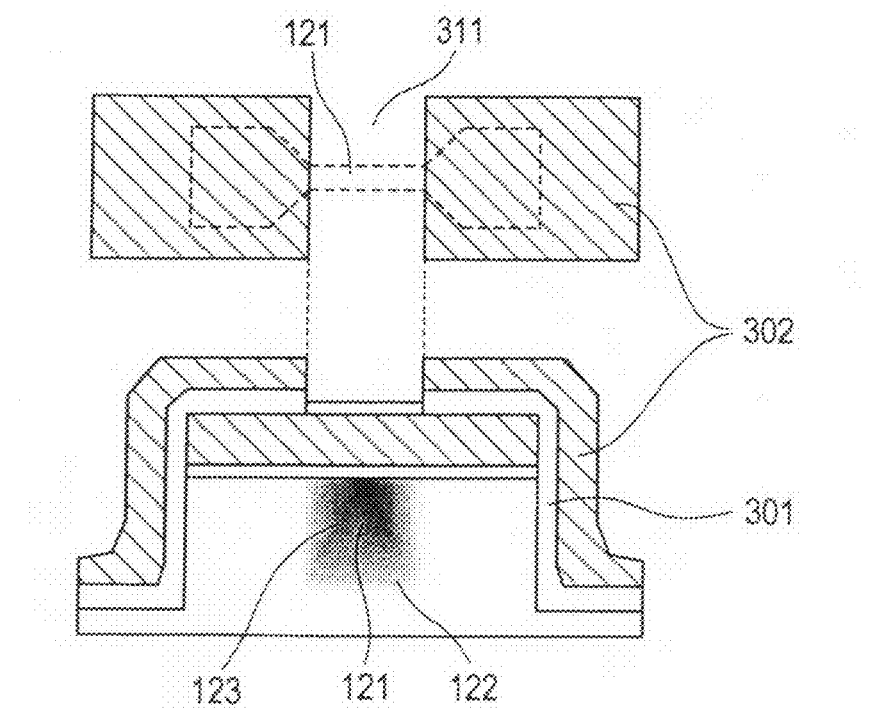

Next, as in FIG. 2B, thermal oxidation of the fin structure 112 is performed. In this embodiment, the mask covers the area around the region where the channel region 121 is to be formed, so generally, by the thermal oxidation, the Ge composition ratio in the channel region 121 is increased, while the Ge composition ratio in the area around the channel region 121 is not increased (FIG. 4B). During the thermal oxidation, the temperature of the thermal oxidation is decreased stepwise or continuously from a high temperature to a low temperature, for example, from 1150° C. to 870° C., according to the increase of Ge composition ratio. By such temperature adjustment, the interdiffusion of the Si and Ge atoms is accelerated, and hence the under channel region 122 having composition gradient of 5%/nm or lower is formed under the channel region 121, and the channel side regions 123 having composition gradient of 5%/nm or lower are formed at sides of the channel region 121. Thereby, the occurrence of lattice defects in the channel region 121, under channel region 122, channel side regions 123, and the like, can be suppressed.

Figure 4C:
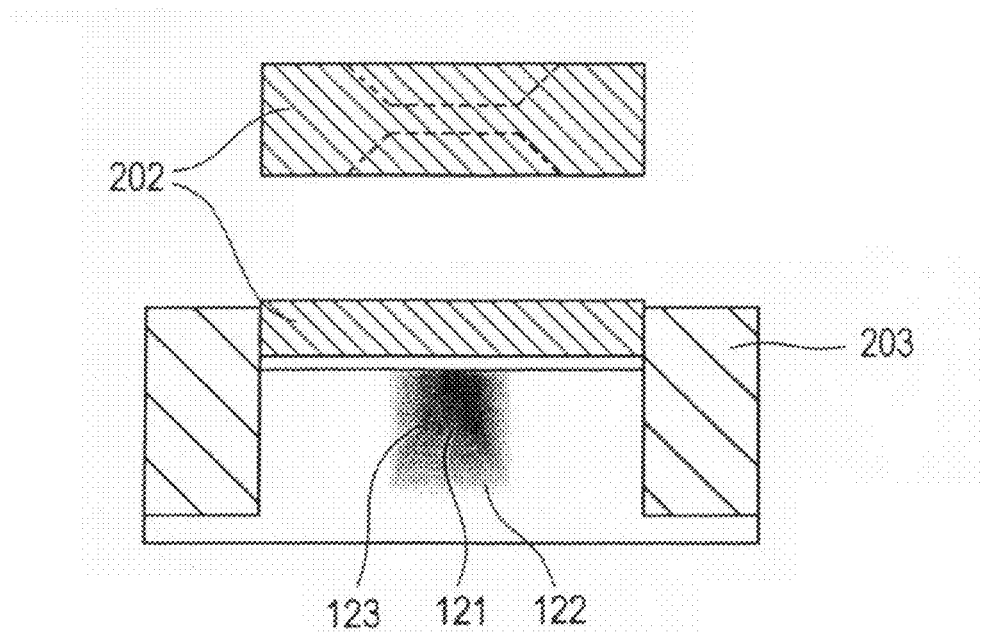

Next, the Si oxide film 301 and the Si nitride film 302 are removed by hot phosphoric acid wet etching. Then, as in FIG. 2C, a Si oxide film 203 is deposited by CVD, so that the region around the fin structure 112 is filled with the Si oxide film 203. Then, the Si oxide film 203 is planarized by CMP until the surface of the Si nitride film 202 is exposed. Then, channel ions and punch-through stopper ions (boron for nMOS and arsenic for pMOS) are implanted into the channel region 121, under channel region 122, and the like (FIG. 4C).

Figure 4D:
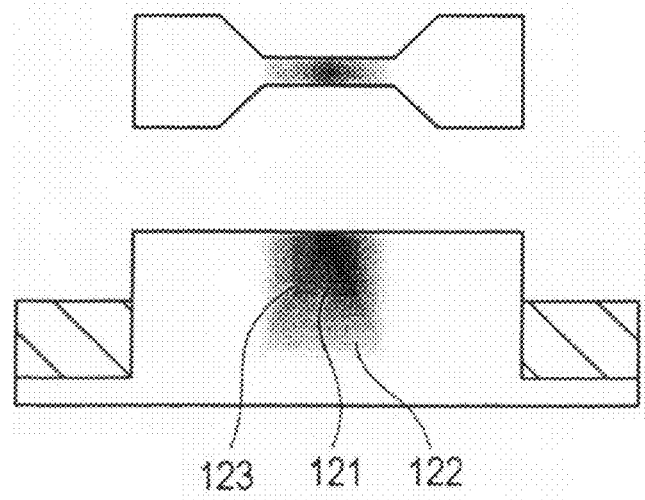

Next, as in FIG. 2D, the Si oxide film 203 is etched to the depth of 100 nm by RIE using the Si nitride film 202 as a mask. Then, the Si nitride film 202, and the residual Si oxide film 203 on the sides of the fin structure 112, are removed by wet etching with hot phosphoric acid and wet etching with diluted hydrofluoric acid. Thereby, a plurality of channel surfaces of the channel region 121 are exposed above the substrate (FIG. 4D).

Figure 4E:
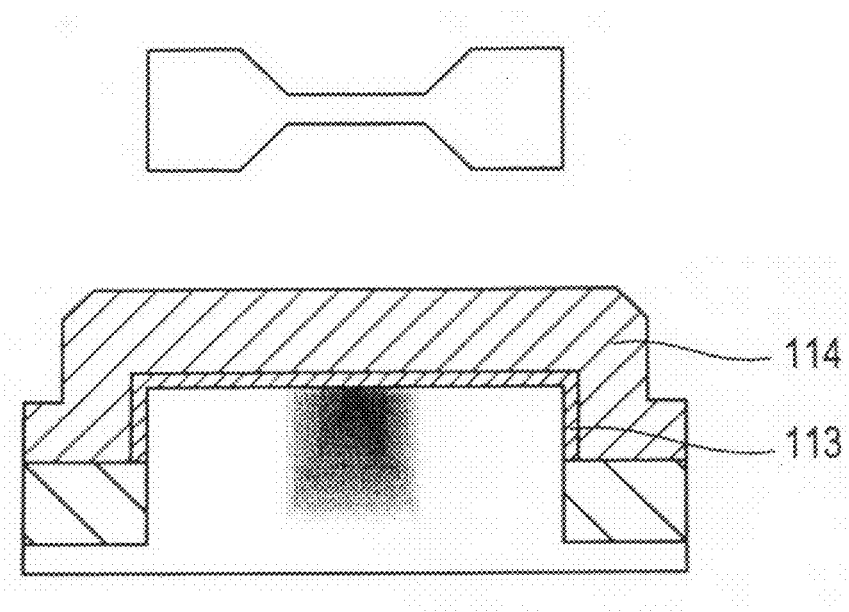

Next, as in FIG. 2E, a HfSiON film 113 which is to be a gate insulating film 113, is deposited by CVD Then, a poly Si layer 114 which is to be a gate electrode 114, is deposited (FIG. 4E).

Figure 4F:
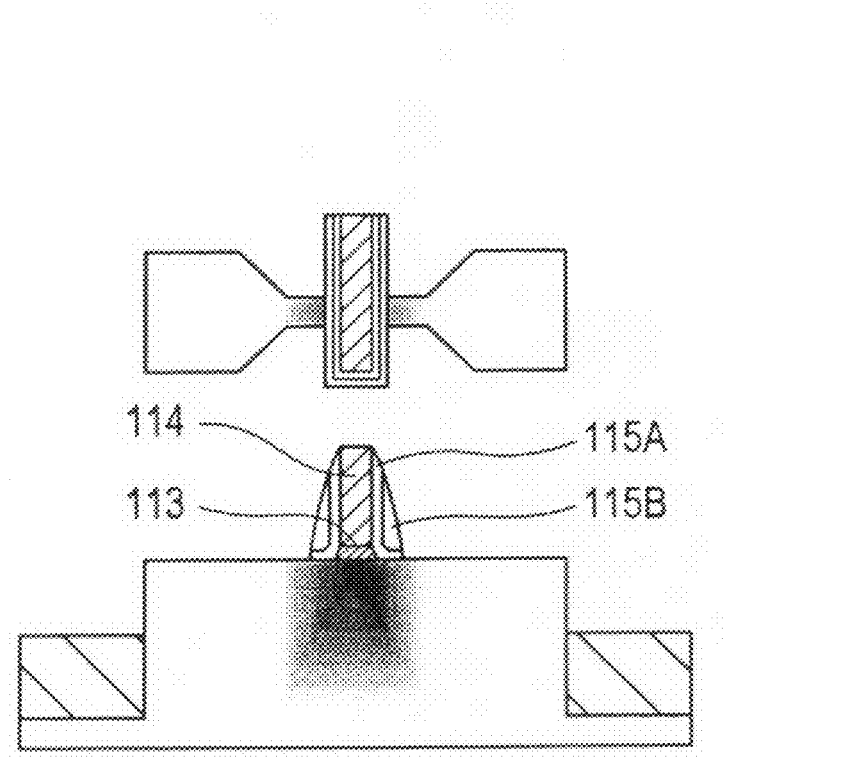

Next, as in FIG. 2F, gate processing is performed by photolithography and RIE. Then, a Si oxide film 115A and a Si nitride film 115B which is to be side wall insulating films 115 (first side wall insulating films) are deposited, and gate side wall processing is performed by RIE (FIG. 4F).

Figure 4G:
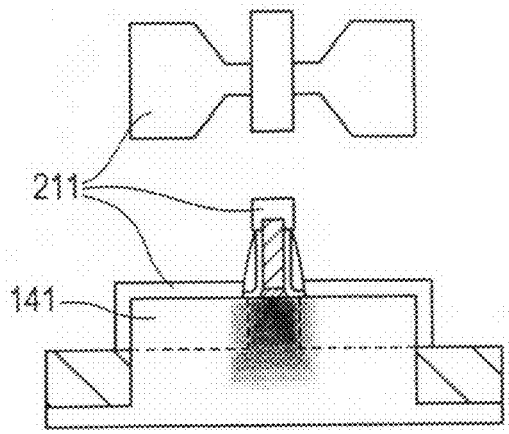

Next, as in FIG. 2G, a SiGe cap 211 is formed on the exposed surface of the fin structure 112 by epitaxial deposition. Then, impurity ions (antimony for nMOS and boron for pMOS) are implanted into the fin structure 112 to form the raised extension region 141 in the fin structure 112. Then, the impurities are activated by RTA (FIG. 4G).

Figure 4H:
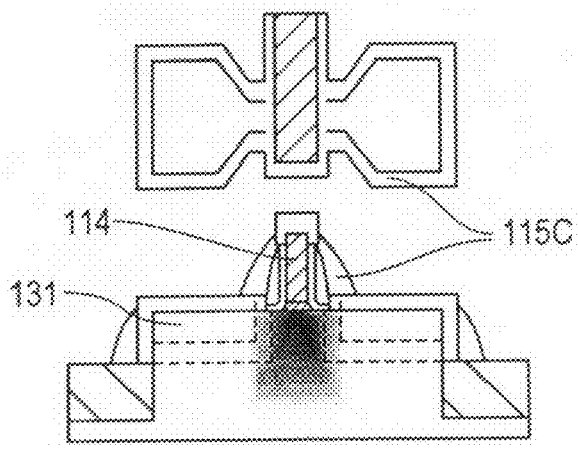
Figure 4:
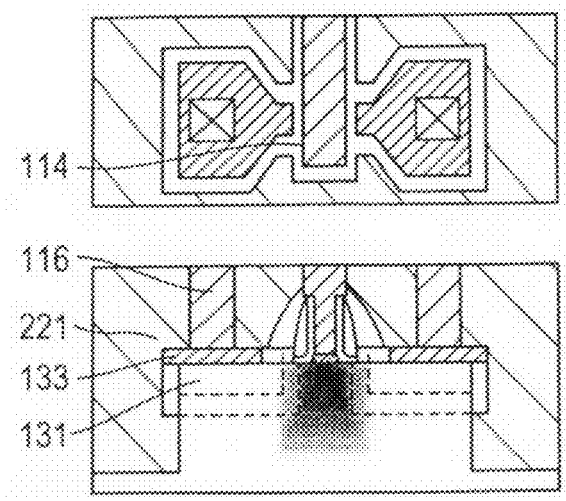

Next, as in FIG. 2H, a Si oxide film 115C which is to be side wall insulating films 115 (second side wall insulating films) is deposited by CVD, and gate side wall processing is performed by RIE. Then, impurity ions (antimony for nMOS and boron for pMOS) are implanted into source/drain regions 131 and a poly Si layer 114 (gate electrode 114) (FIG. 4H).

Next, as in FIG. 2I, the upper sides of the source/drain regions 131 and the entire poly Si layer 114 (gate electrode 114) are Ni-silicided. Then, the gate structure is covered with an interlayer insulating film 221. Then, contact holes are formed in the interlayer insulating film 221. Then, source/drain electrodes 116 are formed in the contact holes. Thereby, the field effect transistor 101 shown in FIG. 3 is completed (FIG. 4I).

(Third Embodiment)

Figure 5:
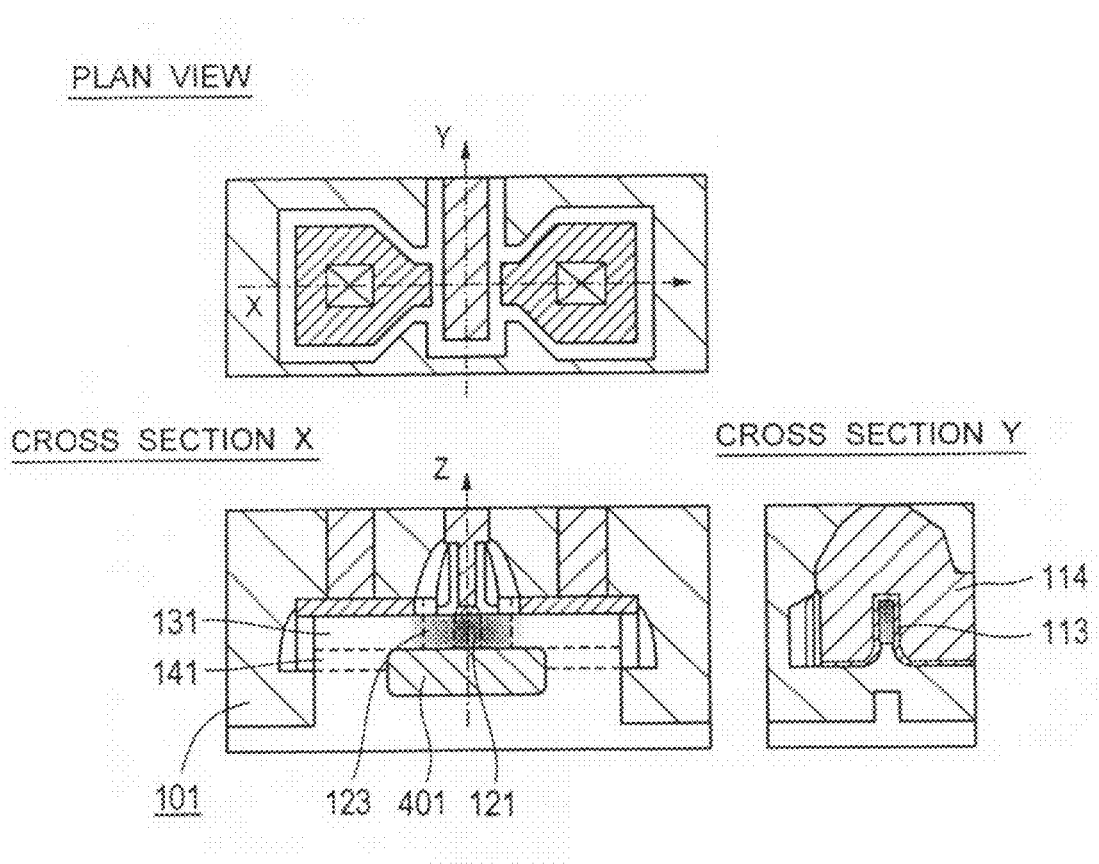
FIG. 5 is an explanatory view showing a transistor of the third embodiment.

FIG. 5 is an explanatory view showing a field effect transistor 101 of the third embodiment.

In the third embodiment, an embedded oxide film 401, which is a specific example of an embedded insulating film, is formed in the region where the under channel region 122 is formed in the second embodiment, and the channel region 121 is formed above the embedded oxide film 401. Therefore, the embedded oxide film 401 is embedded under the channel region 121 in the fin structure 112. In the third embodiment, since the embedded oxide film 401 is thus embedded under the channel region 121, the short channel effect can be further suppressed compared to the first and second embodiments. Furthermore, the leak current from the extension junction can be reduced. As shown in the side cross-sectional view of the Y cross section, the gate insulating film 113 and the gate electrode 114 partially intrude under the channel region 121, which also contributes to the suppression of the short channel effect. Since the other structural features are similar to those of the second embodiment, description thereof will be omitted.

FIGS. 6A to 6G are explanatory views showing a method for manufacturing the field effect transistor 101 of the third embodiment.

Figure 6A:
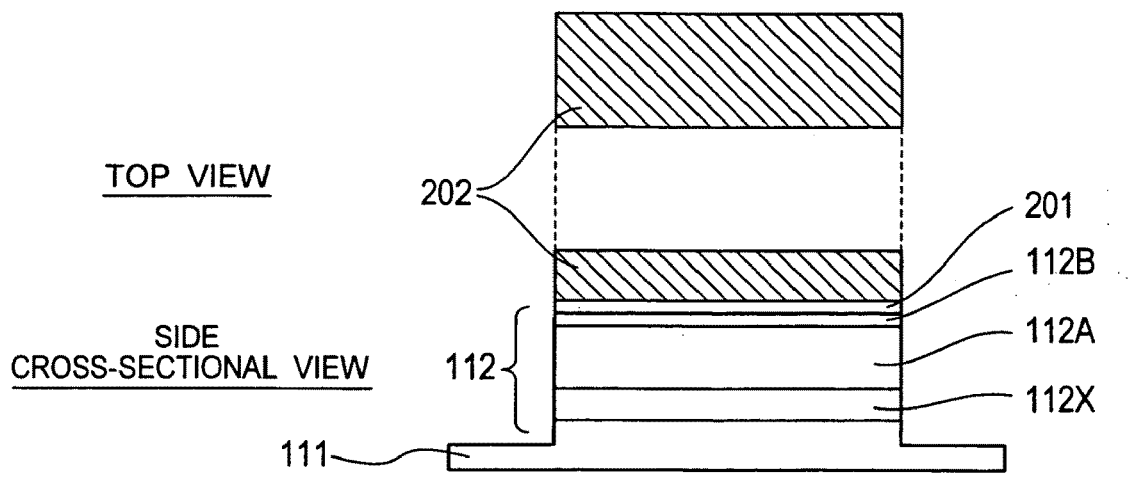
FIGS. 6A to 6G are explanatory views showing a method for manufacturing the transistor of the third embodiment.

Firstly, a strained $Si_{0.4}Ge_{0.6}$ layer 112X having a thickness of 15 nm, a strained $Si_{0.85}Ge_{0.15}$ layer 112A having a thickness of 110 nm, and a Si cap layer 112B having a thickness of 10 nm, are formed by epitaxial deposition as layers forming a fin structure 112. The SiGe layer 112X is formed on a Si substrate 111, the SiGe layer 112A is formed on the SiGe layer 112X, and the Si cap layer 112B is formed on the SiGe layer 112A. Then, a Si thermal oxide film 201 having a thickness of 4 nm is formed on the Si layer 112B by CVD, and a Si nitride film 202 is formed on the Si thermal oxide film 201 by CVD. Then, the Si nitride film 202 is patterned into a square shape by photolithography, and then, the Si layer 112B, the SiGe layer 112A, the SiGe layer 112X, and the Si substrate 111 are etched to the depth of 150 nm by RIE. Thereby, the fin structure 112 is formed on the Si substrate 111 (FIG. 6A).

Figure 6B:
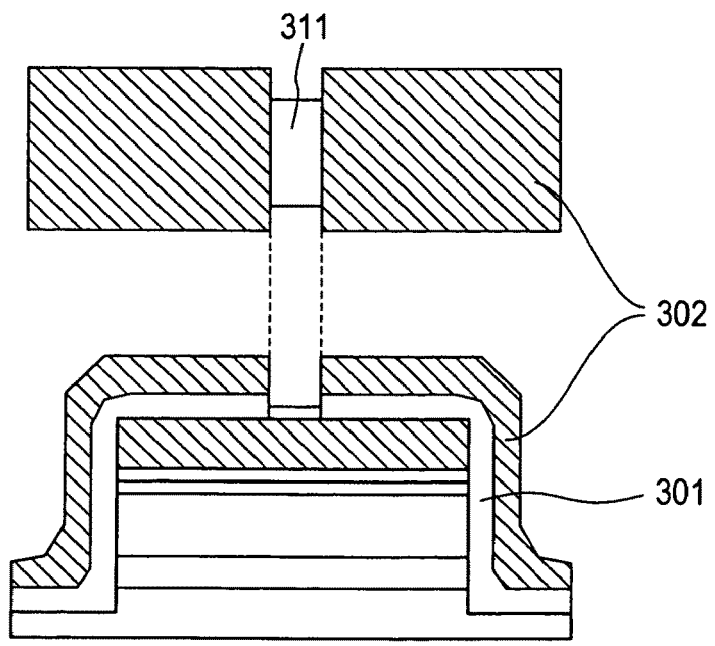

Then, as in FIG. 4A, a Si oxide film 301 is deposited over the entire surface by CVD, and then, a Si nitride film 302 is deposited over the entire surface by CVD. Then, a window 311 is formed in the Si oxide film 301 and the Si nitride film 302 by photolithography and RIE (FIG. 6B).

Figure 6C:
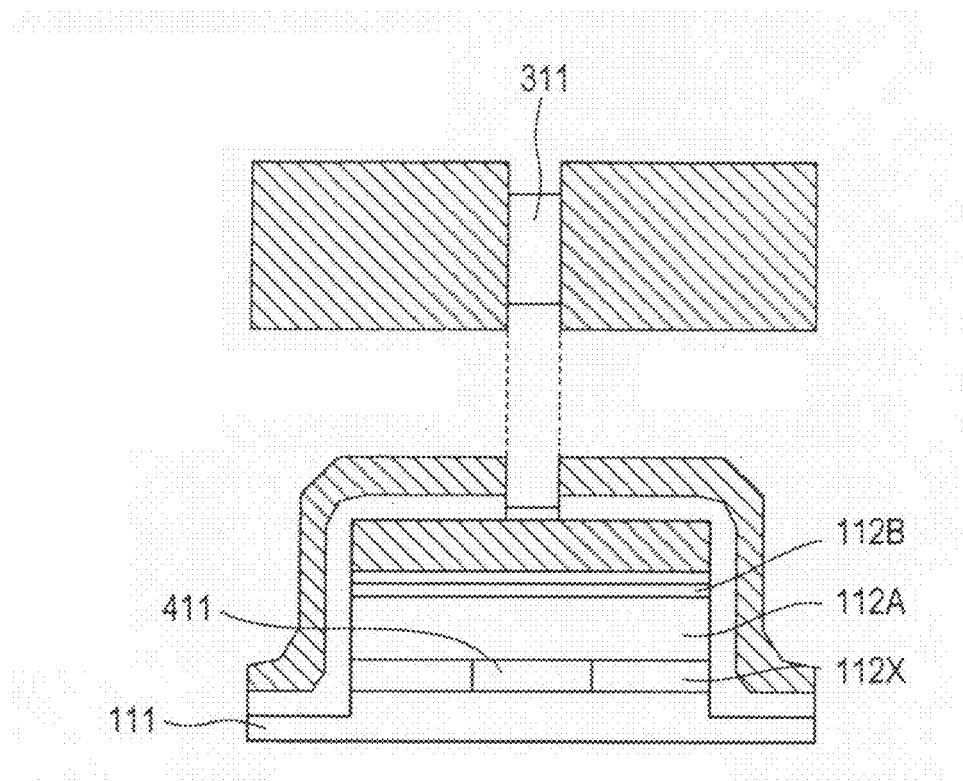

Next, the SiGe layer 112X exposed in the window 311 is removed selectively (i.e. etched selectively) by wet etching with fluoro-nitric acid or CDE, to form a cavity 411 in the fin structure 112 (FIG. 6C).

Figure 6D:
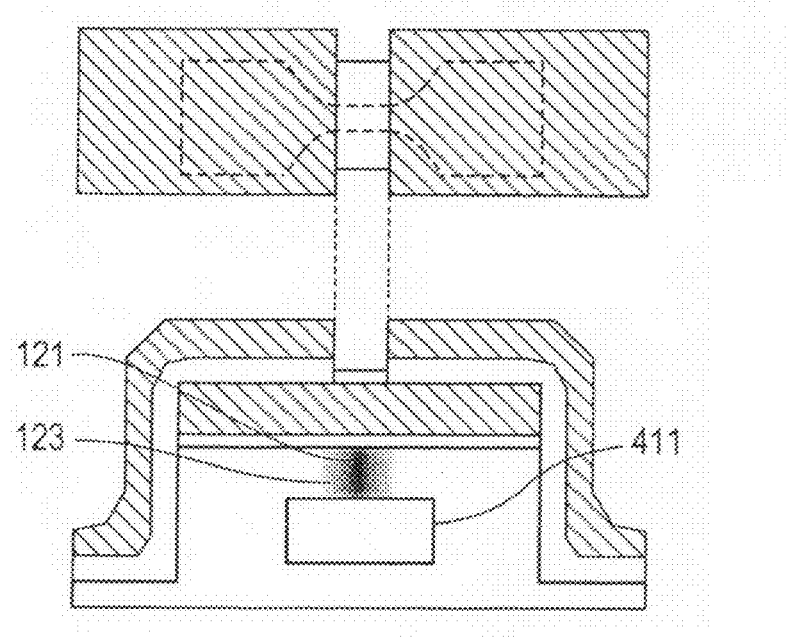

Next, as in FIG. 4B, thermal oxidization of the fin structure 112 is performed. In this embodiment, a mask covers the area around the region where the channel region 121 is to be formed, so generally, by the thermal oxidization, the Ge composition ratio in the channel region 121 is increased, while the Ge composition ratio in the area around the channel region 121 is not increased (FIG. 6D). During the thermal oxidization, the temperature of the thermal oxidization is decreased stepwise or continuously from a high temperature to a low temperature, for example, from 1150° C. to 870° C., according to the increase of Ge composition ratio. By such temperature adjustment, the interdiffusion of the Si and Ge atoms is accelerated, and hence the channel side regions 123 having composition gradient of 5%/nm or lower are formed at sides of the channel region 121. Thereby, the occurrence of lattice defects in the channel region 121, channel side regions 123, and the like, can be suppressed.

Figure 6E:
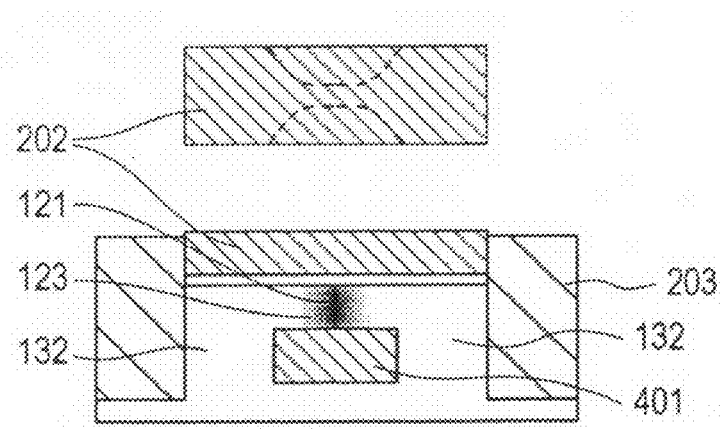

Next, as in FIG. 4C, the Si oxide film 301 and the Si nitride film 302 are removed by hot phosphoric acid wet etching. Then, a Si oxide film 203 is deposited by CVD, so that the region around the fin structure 112 is filled with the Si oxide film 203. Thereby, a oxide film 401 (a part of the Si oxide film 203) is embedded in the cavity 411, i.e., the cavity 411 is filled with an embedded oxide film 401. Then, the Si oxide film 203 is planarized by CMP until the surface of the Si nitride film 202 is exposed. Then, channel impurity ions and punch-through stopper impurity ions (boron for nMOS and arsenic for pMOS) are implanted into the channel region 121, under source/drain regions 132, and the like (FIG. 6E).

Figure 6F:
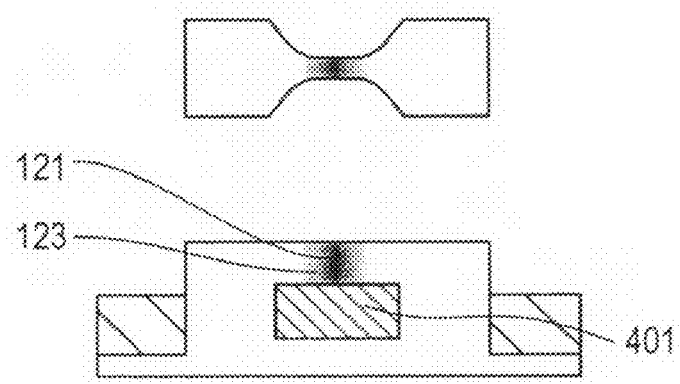

Next, as in FIG. 4D, the Si oxide film 203 is etched to the depth of 100 nm by RIE using the Si nitride film 202 as a mask. Then, the Si nitride film 202, and the residual Si oxide film 203 on the sides of the fin structure 112, are removed by wet etching with hot phosphoric acid and wet etching with diluted hydrofluoric acid. Thereby, a plurality of channel surfaces of the channel region 121 are exposed above the substrate (FIG. 6F).

Figure 6G:
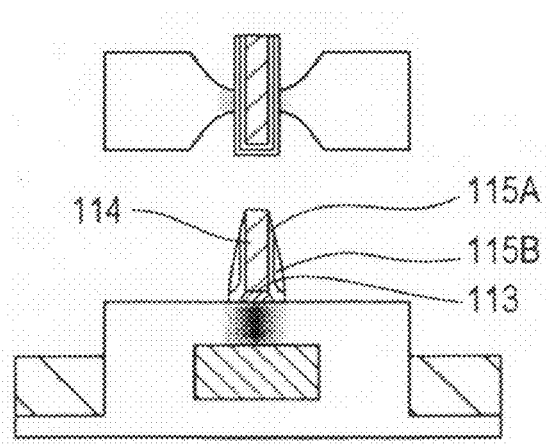

Next, as in FIG. 4E, a HfSiON film 113 which is to be a gate insulating film 113, is deposited by CVD Then, a poly Si layer 114 which is to be a gate electrode 114, is deposited. Then, as in FIG. 4F, gate processing is performed by photolithography and RIE. Then, a Si oxide film 115A and a Si nitride film 115B which is to be side wall insulating films 115 (first side wall insulating films) are deposited, and gate side wall processing is performed by RIE (FIG. 6G).

Then, processes similar to those shown in FIGS. 4G, 4H, and 4I are performed. Thereby, the field effect transistor 101 shown in FIG. 5 is completed.

(Fourth Embodiment)

Figure 7:
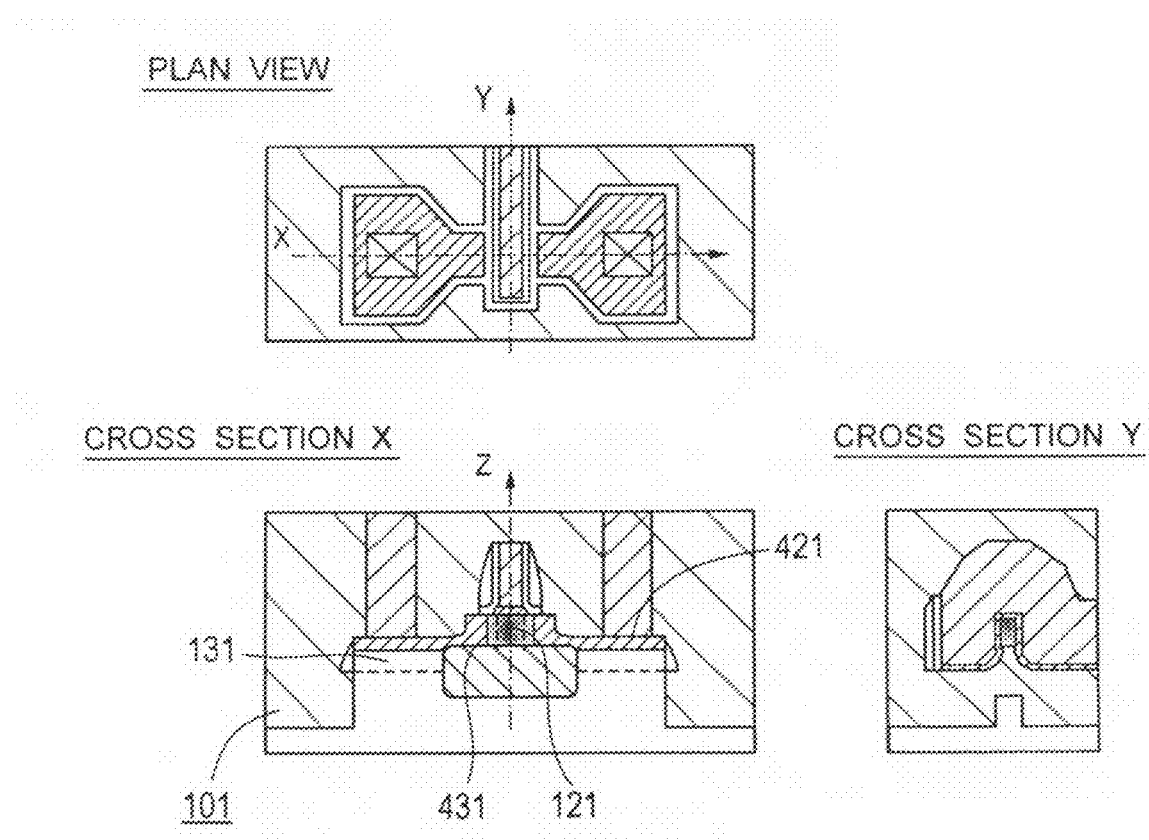
FIG. 7 is an explanatory view showing a transistor of the fourth embodiment.

FIG. 7 is an explanatory view showing a field effect transistor 101 of the fourth embodiment.

The fin structure 112 of the fourth embodiment is almost similar to the fin structure 112 of the third embodiment. One of the differences between the fourth embodiment and the third embodiment is the shape of the fin structure 112. The fin structure 112 of the fourth embodiment has a shape that the fin structure 112 is trimmed at the sides of the channel region 121. Furthermore, in the fourth embodiment, Ni silicide films 421 are formed at the sides of the channel region 121. Since the Ni silicide films 421 are in contact with the channel region 121, carriers are directly supplied from the Ni silicide films 421 to the channel region 121. At the sides of the channel region 121, high concentration impurity regions 431, which are very thin (5 nm or thinner in this embodiment), are formed between the channel region 121 and the Ni silicide films 421. By such a structure, parasitic resistance is reduced compared to the third embodiment which has diffusion layer extensions, so that a high drive current is obtained in the fourth embodiment. Furthermore, in the fourth embodiment, diffusion layer source and drain 131 are formed under the Ni silicide films 421, so that pn junctions are formed between the substrate and the Ni silicide films 421. The Ni silicide films 421 are a specific example of silicide films, and the high concentration impurity regions 431 are a specific example of impurity regions.

Figure 8:
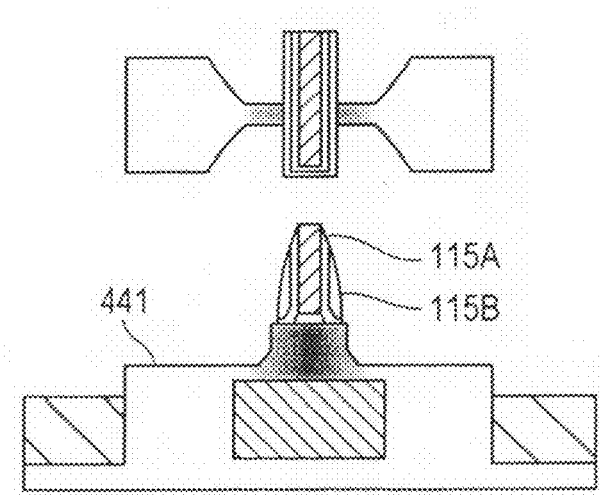
FIG. 8 is an explanatory view showing a method for manufacturing the transistor of the fourth embodiment.

FIG. 8 is an explanatory view showing a method for manufacturing the field effect transistor 101 of the fourth embodiment.

The field effect transistor 101 of the fourth embodiment can be manufactured, by increasing the amount of overetching when the side wall etching is performed in the process shown in FIG. 6G of the third embodiment. This results in providing the fin structure 112 shown in FIG. 8, i.e., the fin structure 112 having a shape that the fin structure 112 is trimmed at the regions 441 where the Ni silicide films 421 are to be formed. Then, the high concentration impurity regions 431, and the semiconductor layers 421 which are to be the Ni silicide films 421, are formed at the sides of the channel region 121. The semiconductor layers 421 are formed in the regions 441 where the Ni silicide films 421 are to be formed. Then, processes similar to those shown in FIGS. 4G, 4H, and 4I are performed. In the process shown in FIG. 4I, the semiconductor layers 421 are Ni-silicided. In this embodiment, the process of forming the second side wall insulating films (FIG. 4G) is not required. By the processes described above, the field effect transistor 101 shown in FIG. 7 is completed.

(Fifth Embodiment)

Figure 9:
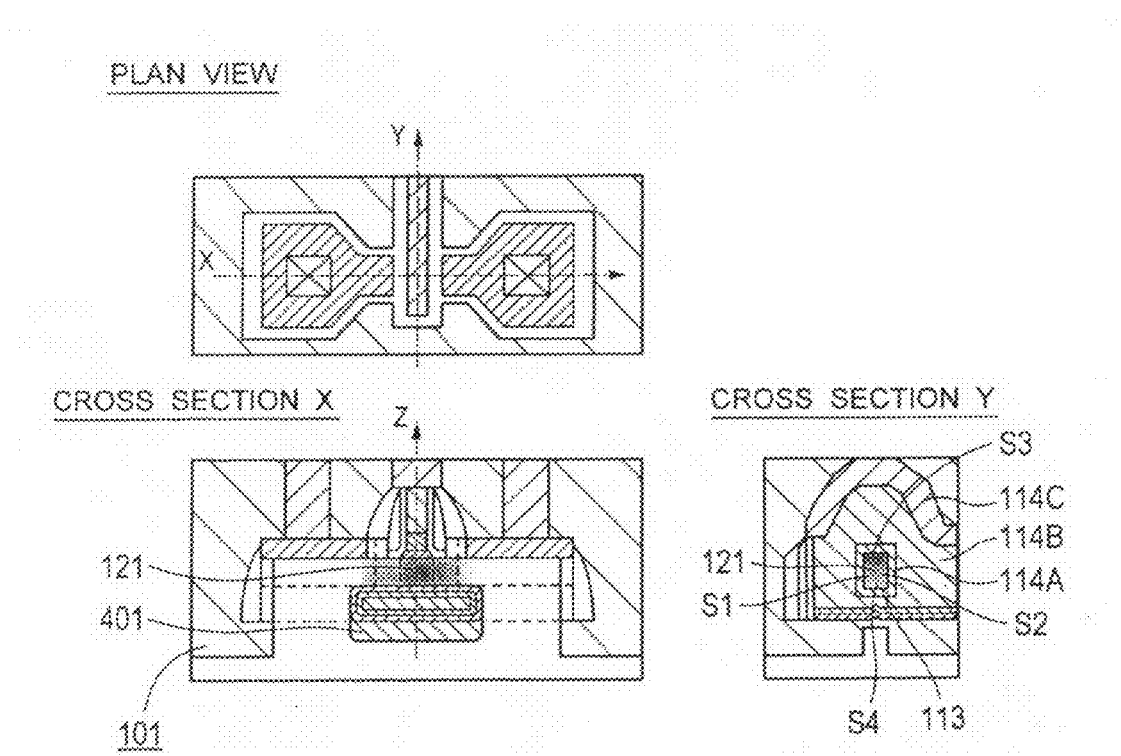
FIG. 9 is an explanatory view showing a transistor of the fifth embodiment.

FIG. 9 is an explanatory view showing a field effect transistor 101 of the fifth embodiment.

While the FET 101 of the third embodiment employs the tri-gate structure, the FET 101 of the fifth embodiment employs the gate-all-around (GAA) structure. Therefore, in the FET 101 of the fifth embodiment, the channel region 121 is surrounded tubularly by the gate insulating film 113 and the gate electrode 114. In the FET 101 of the fifth embodiment, by employing the GAA structure, not only the effect of the FET 101 of the third embodiment is achieved, but also the short channel effect is more suppressed. In this embodiment, the gate electrode 114 is a laminated film (three-layer film) formed of a TiN film 114A, a poly Si film 114B, and a Ni silicide film 114C, and surrounds the channel region 121 via the gate insulating film 113.

As shown in the side cross-sectional view of the Y cross section, the channel surfaces of the channel region 121 of this embodiment are constituted by a first lateral channel surface S1, a second lateral channel surface S2, an upper channel surface 53, and a lower channel surface S4, and these channel surfaces form a tubular shape having a rectangular cross section. The gate insulating film 113 of this embodiment is formed on the tubular channel surface formed of the channel surfaces 51, S2, S3, and S4. The gate electrode 114 (114A and 114B) of this embodiment is formed on the insulating film 113 on the tubular channel surface formed of the channel surfaces S1, S2, S3, and S4.

Figure 10:
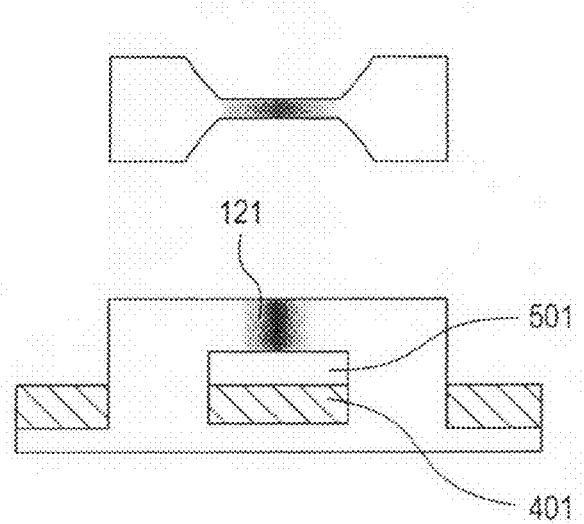
FIG. 10 is an explanatory view showing a method for manufacturing the transistor of the fifth embodiment.

FIG. 10 is an explanatory view showing a method for manufacturing the field effect transistor 101 of the fifth embodiment.

The field effect transistor 101 of the fifth embodiment can be manufactured, by continuing the wet etching of the Si oxide film 203 in the process shown in FIG. 6F of the third embodiment, until a part (upper part) of the embedded oxide film 401 is removed as shown in FIG. 10. Thereby, a cavity 501 in the fin structure 112 is formed under the channel region 121. By forming the gate insulating film 113 and the gate electrode 114 (114A and 114B) under the condition that the cavity 501 is open in the fin structure 112 as shown in FIG. 10, the GAA structure shown in FIG. 9 can be formed. Then, processes similar to those shown in FIGS. 6G, 4G, 4H, and 4I are performed. The gate electrodes 114A and 114B are formed before the cavity 501 is blocked, and the gate electrode 114C is formed after the cavity 501 is blocked. By the processes described above, the field effect transistor 101 shown in FIG. 9 is completed.

(Sixth Embodiment)

Figure 11:
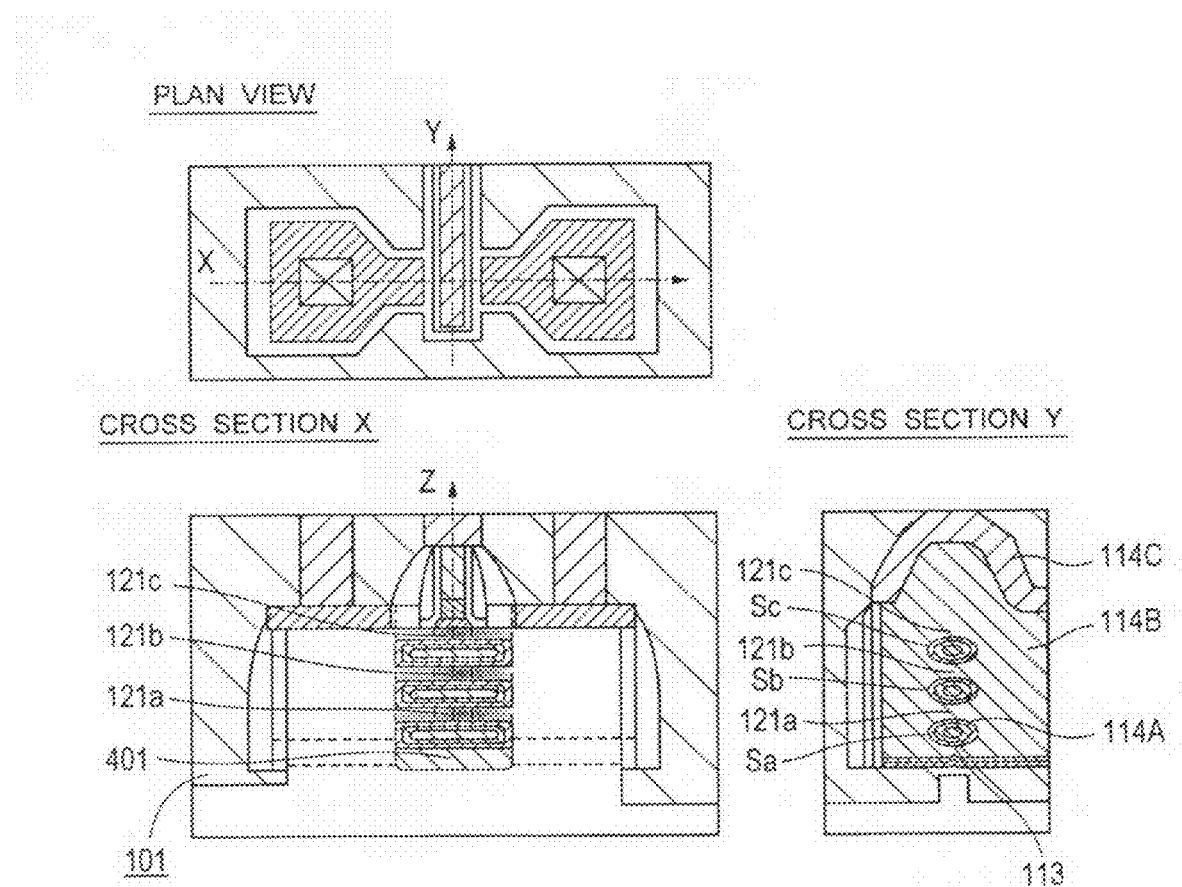
FIG. 11 is an explanatory view showing a transistor of the sixth embodiment.

FIG. 11 is an explanatory view showing a field effect transistor 101 of the sixth embodiment.

In the fifth embodiment, one channel region 121 is formed in one fin structure 112, so that one GAA structure is formed in one fin structure 112. On the other hand, in the sixth embodiment, three channel regions 121a, 121b, and 121c are formed in one fin structure 112, so that three GAA structures are formed in one fin structure 112. Therefore, in the sixth embodiment, one fin structure 112 has a plurality of structures in each of which one of a plurality of the channel regions 121 is surrounded tubularly by the gate insulating film 113 and the gate electrode 114. Thus, in the sixth embodiment, a drive current about three times higher than that in the fifth embodiment is obtained. It is not necessary that the number of the channel regions 121 in one fin structure 112 be limited to three. If the number of the channel regions 121 is N, the drive current becomes about N times higher than that in the fifth embodiment.

In this embodiment, as shown in the side cross-sectional view of the Y cross section, three GAA structures such as, the structure that surrounds the channel region 121a, the structure that surrounds the channel region 121b, and the structure that surrounds the channel region 121c, are formed at three locations such as, the area around the channel region 121a, the area around the channel region 121b, and the area around the channel region 121c. Each of the channel surfaces Sa, Sb, and Sc of the channel regions 121a, 121b, and 121c, forms a tubular shape. The gate insulating film 113 of this embodiment is formed on the tubular channel surfaces Sa, Sb, and Sc. The gate electrode 114 (114A and 114B) of this embodiment is formed on the gate insulating film 113 on the tubular channel surfaces Sa, Sb, and Sc. Each of the channel regions 121a, 121b, and 121c has a thin stick-like shape. Composition of each of the channel regions 121a, 121b, and 121c is similar to the channel region 121 in the first to fifth embodiments. In this embodiment, each of the channel regions 121a, 121b, and 121c is Ge region.

Figure 12A:
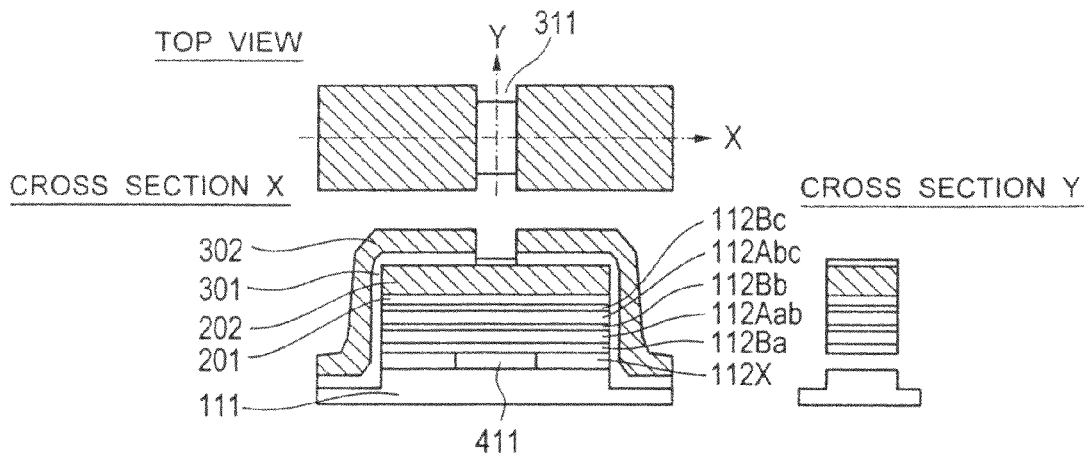
FIGS. 12A to 12C are explanatory views showing a method for manufacturing the transistor of the sixth embodiment.
Figure 12B:
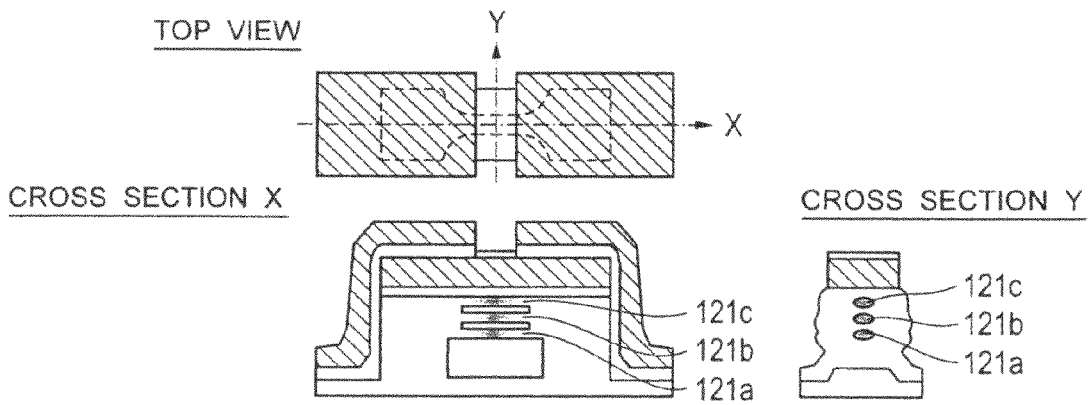
Figure 12C:
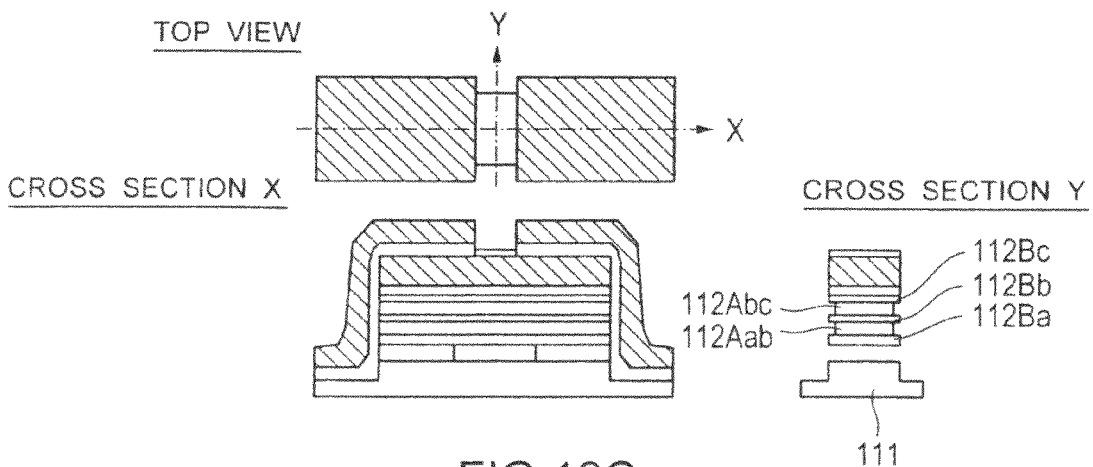

FIGS. 12A to 12C are explanatory views showing a method for manufacturing the field effect transistor 101 of the sixth embodiment.

Firstly, a $Si_{0.4}Ge_{0.6}$ layer 112X, a plurality of $Si_{0.85}Ge_{0.15}$ layers 112Aab and 112Abc, and a plurality of Si layers 112Ba, 112Bb and 112Bc, are formed over a Si substrate 111 by epitaxial deposition as layers forming a fin structure 112. The order of lamination is, from the bottom layer, (the Si substrate 111,) the SiGe layer 112X, the Si layer 112Ba, the SiGe layer 112Aab, the Si layer 112Bb, the SiGe layer 112Abc, and the Si layer 112Bc. Then, processes similar to those shown in FIGS. 6A, 6B, and 6C are performed. Thereby, the structure having the fin structure 112 on the Si substrate 111 shown in FIG. 12A is fabricated.

Next, as in FIG. 6D, thermal oxidization of the fin structure 112 is performed. Thereby, a plurality of channel regions 121a, 121b, and 121c shown in FIG. 12B are formed. This is because, the oxidization speed of SiGe is faster than that of Si, and hence the $Si_{0.85}Ge_{0.15}$ portions of the side walls of the fin structure 112 are recessed relative to the other portions as the thermal oxidization in the fin structure 112 proceeds, so that when the thermal oxidization in the fin structure 112 sufficiently proceeds, the recessed portions are connected to each other, and then a channel region 121 is divided. In such an oxidization process, the interface between SiGe and Si present before oxidization, is eliminated by the interdiffusion of the Si and Ge atoms, and the Ge composition becomes uniform as the oxidization proceeds. Ge is condensed in the regions which are left because of uneven structures on both sides, and $Si_{1-x}Ge_x$ (x≧0.8) channels are formed in part of the regions which have initially been the Si layers. Alternatively, if uneven structures are formed before the thermal oxidization by selective etching with fluoric-nitric acid or the like on the side walls of the fin structure 112, such that the SiGe layers 112Aab and 112Abc are recessed relative to the Si layers 112Ba, 112Bb and 112Bc, as shown in FIG. 12C, there is provided an advantage that the degree of design freedom of the channel size and the channel interval is increased. This is because, while the height of the uneven structures is determined uniquely, in the structure shown in FIG. 12A, by the difference in the oxidization speeds, the height of the uneven structures can be set arbitrarily, in the structure shown in FIG. 12C, in a certain range by adjusting the time of the selective etching.

Then, processes similar to those shown in FIGS. 6E to 6G and FIGS. 4G to 4I are performed as in the fifth embodiment. In the process shown in FIG. 6F, the wet etching of the Si oxide film 203 is continued until a part (upper part) of the embedded oxide film 401 is removed, as in the fifth embodiment. Thereby, the cavities 501 in the fin structure 112 are formed, under the channel region 121a, between the channel region 121a and the channel region 121b, and between the channel region 121b and the channel region 121c. By forming the gate insulating film 113 and the gate electrode 114 (114A and 114B) under the condition that the plurality of cavities 501 are open in the fin structure 112, the plurality of GAA structures can be formed. By the processes described above, the field effect transistor 101 shown in FIG. 11 is thus completed.

In the first to sixth embodiments, various variations are conceivable for the gate insulating film 113, the gate electrode 114, and the source/drain regions 131. Examples of employable materials to form the gate insulating film 113 are $HfSiO_2$, $HfO_2$, $HfArO_x$ and $ZrO_2$, which are high permittivity materials other than HfSiON. Alternatively, the gate insulating film 113 may be a laminated film formed of an insulating film made of any of these high dielectric constant materials and an insulating film made of $SiO_2$ or $GeO_2$. Alternatively, a SiON film or a $SiO_2$ film may also be employed as the gate insulating film 113. Further, as the gate electrode 114, Ni germanoid ($Ni_{1-x}Ge_x$), Ni germano-silicide (NiSi(Ge)), W (tungsten) silicide, TiSiN, TaN, TaSiN, WN, AlN, or the like may be employed.

In the first to sixth embodiments, although the Ge channel or $Si_{1-x}Ge_x$ (x≧0.8) channel is used for both of the nMOS and pMOS which are components of the CMOS, a Si channel may be used for the nMOS. In this case, for example, the SiGe layer 112A and the Si layer 112B may be formed by, forming a selective deposition mask formed of a Si oxide film or a Si nitride film in the nMOS region in advance, then, depositing selectively the SiGe layer 112A and the Si layer 112B in the pMOS region, and then, removing the selective deposition mask. In addition, after the removal of the selective deposition mask, another selective deposition mask may be formed in the pMOS region and further Si may be laminated in the nMOS region by selective epitaxial deposition, to eliminate the step between the nMOS region and the pMOS region. In this case, the Ge composition ratio in the pMOS channel region 121 may be lower than 80%; the Ge composition ratio in the pMOS channel region 121 lower than 80% is desirable. This is because, when the Ge composition ratio in SiGe decreases, the melting point of SiGe increases, and hence the melting point of SiGe approaches the melting point of Si, so that the process temperature of SiGe-pMOS can be easily approached the process temperature of Si-nMOS. The contents of this paragraph will also be described in the following seventh embodiment.

(Seventh Embodiment)

Figure 13:
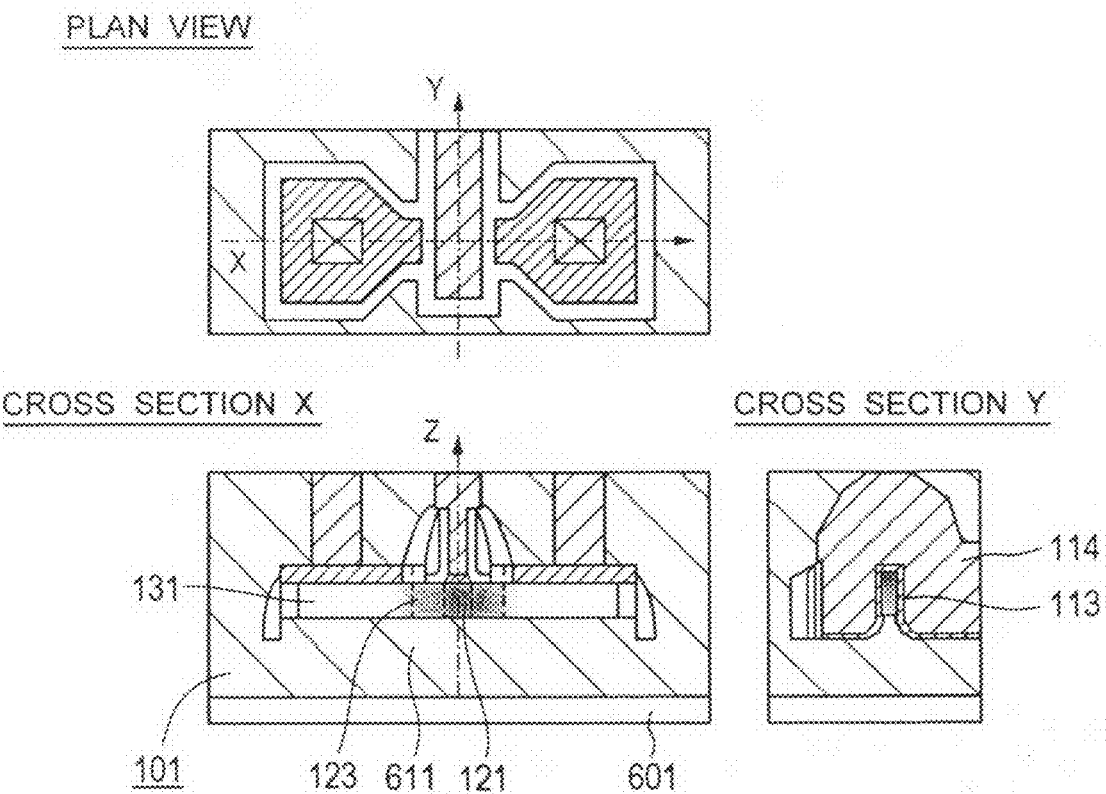
FIG. 13 is an explanatory view showing a transistor of the seventh embodiment.

FIG. 13 is an explanatory view showing a field effect transistor 101 of the seventh embodiment.

The FET 101 shown in FIG. 13 is an example in which an SOI (Semiconductor-On-Insulator) substrate 601 is used as the substrate instead of the bulk Si substrate 111. The FET 101 shown in FIG. 13 employs a structure in which the embedded oxide film 401 under the channel in the third embodiment is replaced with an embedded oxide film 611 that forms the SOI substrate 601. Therefore, the embedded oxide film 611, which is a specific example of an embedded insulating film, is also present under the source and drain. This embodiment has a disadvantage that the cost of the substrate is increased compared to the third embodiment, but has advantages that, not only the effect of the third embodiment is achieved, but also the off-state current can be reduced since the source/drain regions 131 are well-insulated from the substrate 601. Furthermore, with regard to the manufacturing process thereof, this embodiment has an advantage that the processes of etching back the interlayer film and exposing the fin as shown in FIG. 6F are not required, which simplifies the manufacturing process.

(Eighth Embodiment)

Figure 14:
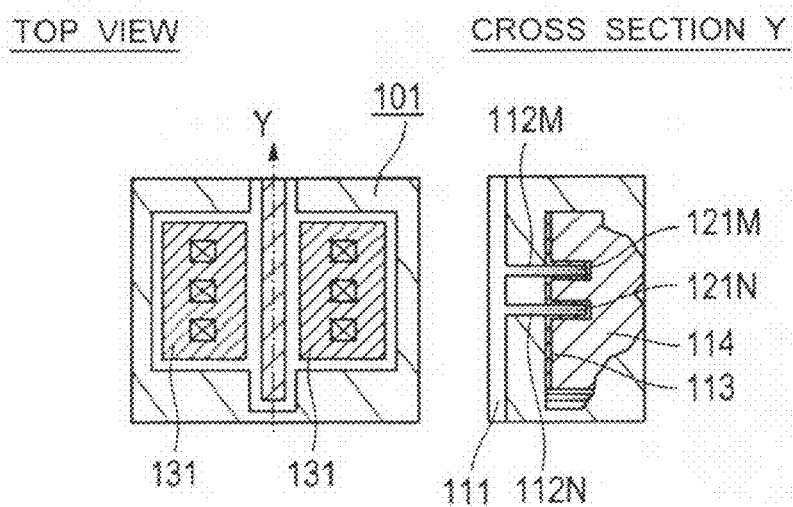
FIG. 14 is an explanatory view showing a transistor of the eighth embodiment.

FIG. 14 is an explanatory view showing a field effect transistor 101 of the eighth embodiment.

The FET 101 shown in FIG. 14 includes a Si substrate 111, a first fin structure 112M, a second fin structure 112N, a gate insulating film 113, and a gate electrode 114.

The first fin structure 112M and the second fin structure 112N are formed on the common Si substrate 111. Each of the first fin structure 112M and the second fin structure 112N corresponds to any one of the fin structures of the first to sixth embodiments. A first channel region 121M, which is a Ge region or a SiGe region, is formed in the first fin structure 112M, and a second channel region 121N, which is a Ge region or a SiGe region, is formed in the second fin structure 112N. The common source/drain regions 131 are formed at the sides of the first channel region 121M and the second channel region 121N. The gate insulating film 113 is formed on the first channel region 121M and the second channel region 121N (particularly in this embodiment, on the surface across a plurality of channel surfaces of the first channel region 121M and a plurality of channel surfaces of the second channel region 121N). The gate electrode 114 is formed on the gate insulating film 113 on the first channel region 121M and the second channel region 121N (particularly in this embodiment, on the surface across a plurality of channel surfaces of the first channel region 121M and a plurality of channel surfaces of the second channel region 121N).

In the FET 101 shown in FIG. 14, since the first channel region 121M and the second channel region 121N are connected to the common source/drain regions 131, the FET 101 shown in FIG. 14 can be handled as a single transistor. In the FET 101 shown in FIG. 14, since the effective channel width is twice the channel width of the FET 101 shown in FIG. 1 and the like, a drain current two times higher than that in the FET 101 shown in FIG. 1 and the like, is obtained.

The FET 101 shown in FIG. 14 may include three or more fin structures 112 each of which corresponds to any one of the fin structures of the first to sixth embodiments. Furthermore, the FET 101 shown in FIG. 14 may include also one or more fin structures 112 each of which corresponds to none of the fin structures of the first to sixth embodiments.

The FET 101 shown in FIG. 14 can be manufactured by using any one of the manufacturing methods of the first to sixth embodiments. However, the gate insulating film 113, the gate electrode 114, and the source/drain regions 131 need to be common to the first channel region 121M and the second channel region 121N.

(Ninth Embodiment)

Figure 15:
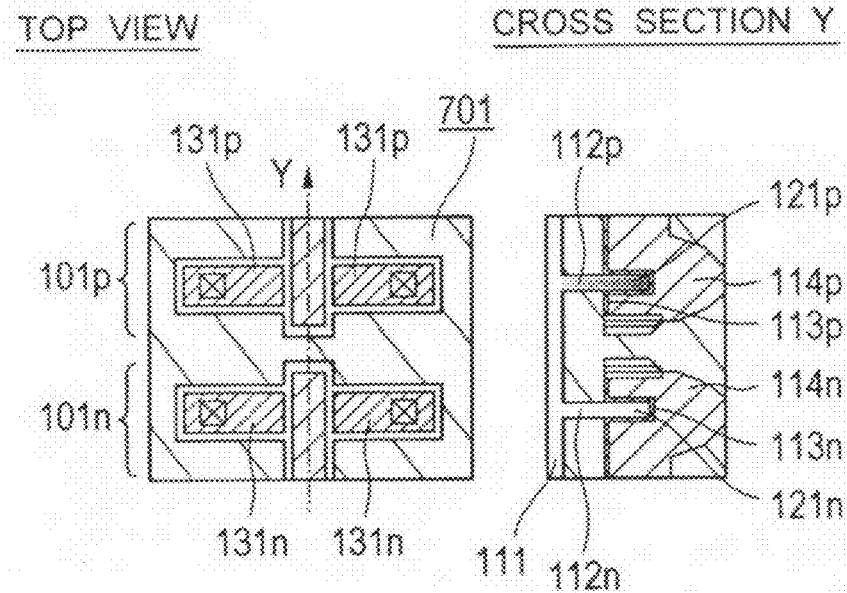
FIG. 15 is an explanatory view showing a CMOS circuit of the ninth embodiment.

FIG. 15 is an explanatory view showing (main components of) a CMOS circuit 701 of the ninth embodiment.

The CMOS circuit 701 shown in FIG. 15 is constituted by a pMOS 101p and an nMOS 101n. The pMOS 101p is a SiGe-FinFET that corresponds to any one of the FETs of the first to eighth embodiments, while the nMOS 101n is a Si-FinFET that corresponds to none of the FETs of the first to eighth embodiments. The CMOS circuit 701 shown in FIG. 15 corresponds to a specific example of an integrated circuit element, i.e., a complementary MIS (Metal-Insulator-Semiconductor) circuit element, of the present invention.

The pMOS 101p and the nMOS 101n are formed on the common Si substrate 111. A fin structure 112p which forms the pMOS 101p, and a fin structure 112n which forms the nMOS 101n, are formed on the Si substrate 111. The fin structure 112p is a SiGe-Fin that corresponds to any one of the fin structures of the first to eighth embodiments, while the fin structure 112n is a Si-Fin that corresponds to none of the fin structures of the first to eighth embodiments.

A channel region 121p, which is a $Si_{0.6}Ge_{0.4}$ region, is formed in the fin structure 112p. A gate insulating film 113p is formed on a plurality of the channel surfaces of the channel region 121p. A gate electrode 114p is formed on the gate insulating film 113p on a plurality of the channel surfaces of the channel region 121p. A channel region 112n, which is a Si region, is formed in the fin structure 112n. A gate insulating film 113n is formed on a plurality of the channel surfaces of the channel region 121n. A gate electrode 114n is formed on the gate insulating film 113n on a plurality of the channel surfaces of the channel region 121n.

In the ninth embodiment, not only the pMOS 101p, but also the nMOS 101n, can be manufactured by using any one of the manufacturing methods of the first to eighth embodiments. However, a Si-Fin instead of a SiGe-Fin is formed, as the fin structure 112n of the nMOS 101n. When the fin structures 112p and 112n are formed, the things described in the last paragraph in the sixth embodiment are to be taken into account. With regard to the Si-Fin of the nMOS 101n and the SiGe-FinFET of the pMOS 101p, the Si-Fin corresponds to the SiGe-FinFET whose Ge atoms are replaced with Si atoms.

In the first to ninth embodiments, the combination of the surface orientation of the substrate and the channel direction of the transistor is arbitrarily configured. Specific examples of representative combinations include, the [110]-direction channel combined with the substrate having a principal plane (001), the [100]-direction channel combined with the substrate having a principal plane (001), the [100]-direction channel combined with the substrate having a principal plane (011), and the [01-1]-direction channel combined with the substrate having a principal plane (011). Further, an SOI substrate can be used as the substrate in the embodiments other than the seventh embodiment. In this case, as in the seventh embodiment, there is a disadvantage in terms of the substrate cost, but there are advantages in terms of the reduced off-state current and the simplified manufacturing process.

As described above, the embodiments of the present invention provides novel field effect transistor and manufacturing method thereof, with regard to a field effect transistor having a multi-gate structure provided with a channel region containing Ge atoms, and a manufacturing method thereof.

The invention claimed is:

1. A field effect transistor comprising:
a semiconductor substrate containing Si atoms;
a protruding structure formed on the semiconductor substrate;
a channel region formed in the protruding structure and containing Ge atoms;
an insulating film embedded under the channel region;
source/drain regions formed at sides of the channel region and containing Si and Ge atoms, a Ge composition ratio among Si and Ge atoms contained in the source/drain regions being lower than a Ge composition ratio among Si and Ge atoms contained in the channel region;
channel side regions formed between the channel region and the source/drain regions at sides of the channel region and containing Si and Ge atoms, a Ge composition ratio among Si and Ge atoms contained in the channel side regions continuously changing from the channel region sides to the source/drain region sides;
a gate insulating film formed on the channel region; and
a gate electrode formed on the gate insulating film on the channel region.

2. A field effect transistor comprising:
a semiconductor substrate containing Si atoms;
a protruding structure formed on the semiconductor substrate;
a channel region formed in the protruding structure and containing Ge atoms;
an insulating film embedded under the channel region;
a gate insulating film formed on the channel region;
a gate electrode formed on the gate insulating film on the channel region;
silicide films formed at sides of the channel region;
source/drain regions formed under the silicide films; and
impurity regions formed between the channel region and the silicide films at sides of the channel region.

3. A field effect transistor comprising:
a semiconductor substrate containing Si atoms;
a protruding structure formed on the semiconductor substrate;
a channel region formed in the protruding structure and containing Ge atoms;
an insulating film embedded under the channel region;
a gate insulating film formed on the channel region; and
a gate electrode formed on the gate insulating film on the channel region,
wherein the protruding structure has a structure in which the channel region is surrounded tubularly by the gate insulating film and the gate electrode.

4. The field effect transistor according to claim 3, wherein a plurality of channel regions are formed in the protruding structure, and the protruding structure has a plurality of structures in each of which one of the plurality of channel regions is surrounded tubularly by the gate insulating film and the gate electrode.

5. The field effect transistor according to claim 1, further comprising:
another protruding structure formed on the semiconductor substrate; and
another channel region formed in the another protruding structure and containing Ge atoms;
wherein the gate insulating film is formed on the channel region and the another channel region, and the gate electrode is formed on the gate insulating film on the channel region and the another channel region.

6. An integrated circuit element which is a complementary MIS (Metal-Insulator-Semiconductor) circuit element comprising a P-type field effect transistor and an N-type field effect transistor,
wherein the P-type field effect transistor is a field effect transistor according to claim 1, and the N-type field effect transistor is a field effect transistor according to claim 1 in which Ge atoms in the channel region are replaced with Si atoms.

7. The field effect transistor according to claim 2, further comprising:
another protruding structure formed on the semiconductor substrate; and
another channel region formed in the another protruding structure and containing Ge atoms;
wherein the gate insulating film is formed on the channel region and the another channel region, and the gate electrode is formed on the gate insulating film on the channel region and the another channel region.

8. An integrated circuit element which is a complementary MIS (Metal-Insulator-Semiconductor) circuit element comprising a P-type field effect transistor and an N-type field effect transistor,
wherein the P-type field effect transistor is a field effect transistor according to claim 2, and the N-type field effect transistor is a field effect transistor according to claim 2 in which Ge atoms in the channel region are replaced with Si atoms.

9. The field effect transistor according to claim 3, further comprising:
another protruding structure formed on the semiconductor substrate; and
another channel region formed in the another protruding structure and containing Ge atoms;
wherein the gate insulating film is formed on the channel region and the another channel region, and the gate electrode is formed on the gate insulating film on the channel region and the another channel region.

10. An integrated circuit element which is a complementary MIS (Metal-Insulator-Semiconductor) circuit element comprising a P-type field effect transistor and an N-type field effect transistor,
wherein the P-type field effect transistor is a field effect transistor according to claim 3, and the N-type field effect transistor is a field effect transistor according to claim 3 in which Ge atoms in the channel region are replaced with Si atoms.

* * * * *